United States Patent [19]
Fjelstad et al.

[11] Patent Number: 6,086,386
[45] Date of Patent: *Jul. 11, 2000

[54] FLEXIBLE CONNECTORS FOR MICROELECTRONIC ELEMENTS

[75] Inventors: Joseph Fjelstad, Sunnyvale; Thomas H. DiStefano, Monte Sereno; Konstantine Karavakis, Pleasanton, all of Calif.; Anthony B. Faraci, Georgetown, Tex.; Tan Nguyen, Santa Clara, Calif.

[73] Assignee: Tessera, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/862,151

[22] Filed: May 22, 1997

Related U.S. Application Data

[60] Provisional application No. 60/018,304, May 24, 1996.

[51] Int. Cl.⁷ .................................................. H01R 12/00
[52] U.S. Cl. ............................. 439/70; 29/843; 324/754; 324/755; 324/757; 324/765; 228/180.1; 361/774
[58] Field of Search .................... 439/66, 70; 228/180.1; 29/830, 840, 843, 882–885, 829–835, 838, 854–857, 813, 875, 876, 844; 324/754, 755, 757, 765; 361/774, 776, 768

[56] References Cited

U.S. PATENT DOCUMENTS

| | | | |
|---|---|---|---|
| 5,053,922 | 10/1991 | Matta et al. ............................ | 361/386 |
| 5,086,337 | 2/1992 | Noro et al. ............................... | 357/79 |
| 5,133,495 | 7/1992 | Angulas et al. ...................... | 228/180.1 |
| 5,152,695 | 10/1992 | Grabbe et al. ............................. | 439/71 |
| 5,199,879 | 4/1993 | Kohn et al. ................................ | 439/63 |
| 5,282,312 | 2/1994 | DiStefano et al. ......................... | 29/830 |
| 5,430,614 | 7/1995 | Difrancesco ............................ | 361/785 |
| 5,474,458 | 12/1995 | Vafi et al. .............................. | 439/66 X |
| 5,615,824 | 4/1997 | Fjelstad et al. ........................ | 228/18.1 |
| 5,723,347 | 3/1998 | Hirano et al. .............................. | 437/8 |
| 5,784,262 | 7/1998 | Sherman ................................. | 361/777 |
| 5,811,982 | 9/1998 | Beaman et al. ......................... | 324/762 |
| 5,812,378 | 9/1998 | Fjestad et al. ........................... | 361/769 |

*Primary Examiner*—Steven L. Stephan
*Attorney, Agent, or Firm*—Lerner, David, Littenberg Krumholz & Mentlik, LLP

[57] ABSTRACT

A connector for microelectronic elements includes a sheet-like body having a plurality of active contacts arranged in a regular grid pattern. The active contacts may include several sheetlike metallic projections extending inwardly around a hole in the sheetlike element, on a first major surface of the sheetlike element. A support structure such as a grid array of noncollapsing structural posts is on a second major surface of the sheetlike element, and each of the posts is electrically connected to one of the active contacts. The grid array of posts and the grid array of active contacts are offset from one another so that an active contact is surrounded by several posts. The posts support the sheetlike element spaced away from a substrate to which the posts are attached. A microelectronic element having bump leads thereon may be engaged by contacting the bump leads with the active contacts, and deflecting the sheetlike element between the bump leads on one side and the posts on the other side. The assembly can be tested, and if found acceptable, the bump leads can be permanently bonded to the contacts.

46 Claims, 13 Drawing Sheets

FLEXIBLE CONNECTORS FOR MICROELECTRONIC ELEMENTS

The present application claims the benefit of United States Provisional Application, Ser. No. 60/018,304, filed May 24, 1996, the disclosure of which is hereby incorporated by reference herein.

FIELD OF THE INVENTION

The present invention relates to components useful for mounting semiconductor chips and related electronic components, to assemblies made using such components and to methods of making such components and assemblies.

BACKGROUND OF THE INVENTION

Modern electronic devices utilize semiconductor chips, commonly referred to as "integrated circuits" which incorporate numerous electronic elements. These chips are mounted on substrates which physically support the chips and electrically interconnect each chip with other elements of the circuit. The substrate may be a part of a discrete chip package used to hold a single chip and equipped with terminals for interconnection to external circuit elements. Such substrates may be secured to an external circuit board or chassis. Alternatively, in a so-called "hybrid circuit" one or more chips are mounted directly to a substrate forming a circuit panel arranged to interconnect the chips and the other circuit elements mounted to the substrate. In either case, the chip must be securely held on the substrate and must be provided with reliable electrical interconnection to the substrate. The interconnection between the chip itself and its supporting substrate is commonly referred to as "first level" assembly or chip interconnection, as distinguished from the interconnection between the substrate and the larger elements of the circuit, commonly referred to as a "second level" interconnection.

The structures utilized to provide the first level connection between the chip and the substrate must accommodate all of the required electrical interconnections to the chip. The number of connections to external circuit elements, commonly referred to as "input-output" or "I/O" connections, is determined by the structure and function of the chip. Advanced chips capable of performing numerous functions may require substantial numbers of I/O connections.

The size of the chip and substrate assembly is a major concern. The size of each such assembly influences the size of the overall electronic device. More compact assemblies, with smaller distances between chips provide smaller signal transmission delays and hence permit faster operation of the device.

First level interconnection structures connecting a chip to a substrate ordinarily are subject to substantial strain caused by thermal cycling as temperatures within the device change during operation. The electrical power dissipated within the chip tends to heat the chip and substrate, so that the temperatures of the chip and substrate rise each time the device is turned on and fall each time the device is turned off. As the temperatures change, the chip and substrate may expand and contract by different amounts. This causes the electrical contacts on the chip to move relative to the electrical contact pads on the substrate. This relative movement deforms the electrical interconnections between the chip and substrate and places them under mechanical stress. These stresses are applied repeatedly with repeated operation of the device, and can cause breakage of the electrical interconnections.

Moreover, despite all of the efforts made during manufacture of the chips, some chips will be defective. These defects often cannot be detected until the chip is operated under power in a test fixture or in an actual assembly. A single bad chip can make a larger assembly including numerous chips and other valuable components worthless, or can require painstaking procedures to extricate the bad chip from the assembly. Therefore, the chips and the mounting components used in any chip assembly system should permit testing of chips and replacement of defective chips before the chips are fused to a substrate. The cost of the chip and substrate assembly is also a major concern.

All these concerns, taken together, present a formidable engineering challenge. Various attempts have been made heretofore to provide first-level interconnection structures and methods to meet these concerns. At present, the most widely utilized primary interconnection methods are wire bonding, tape automated bonding or "TAB" and flip-chip bonding.

In wire bonding, the substrate has a top surface with a plurality of electrically conductive contact pads or lands disposed in a ring-like pattern. The chip is secured to the top surface of the substrate at the center of the ring-like pattern, so that the chip is surrounded by the contact pads on the substrate. The chip is mounted in a face-up disposition, with the back surface of the chip confronting the top surface of the substrate and with the front surface of the chip facing upwardly, away from the substrate, so that electrical contacts on the front surface are exposed. Fine wires are connected between the contacts on the front face of the chip and the contact pads on the top surface of the substrate. These wires extend outwardly from the chip to the surrounding contact pads on the substrate. In wire bonded assembly, the area of the substrate occupied by the chip, the wires and the contact pads of the substrate is substantially greater than the surface area of the chip itself. Moreover, the wire bonding process does not provide any pre-testing of the chip, so that the chip must be tested using separate equipment. Thus, the bare chip must be tested using separate equipment before the wire bonding process. Testing a bare chip poses numerous practical difficulties. Thus, it is difficult to make reliable low inductance electrical connections with all of the contacts on the chip simultaneously. Elder et al, U.S. Pat. No. 5,123,850 and Jameson et al, U.S. Pat. No. 4,783,719 disclose chip testing fixtures in which conductive elements on a flexible device are pressed against electrical contacts of the chip.

In the TAB process, a polymer tape is provided with thin layers of metallic material forming conductors on a first surface of the tape. These conductors are arranged generally in a fan-out pattern and extend generally radially, away from the center of the pattern. The chip is placed on the tape in a face down arrangement, with contacts on the front surface of the chip confronting the conductors on the first surface of the tape. The contacts on the chip are bonded to the conductors on the tape. Because the leads utilized in tape automated bonding extend outwardly in a radial, fan-out pattern from the chip, the assembly is much larger than the chip itself. Enochs, U.S. Pat. No. 4,597,617 and Matta et al, U.S. Pat. No. 5,053,922 disclose variants of the TAB process in which the outer ends of the leads on the tape are placed in contact with the substrate by mechanical pressure, rather than by metallurgical bonding.

In flip-chip bonding, contacts on the front surface of the chip are provided with bump leads such as balls of solder protruding from the front surface of the chip. The substrate has contact pads arranged in an array corresponding to the array of contacts on the chip. The chip, with the solder bumps, is inverted so that its front surface faces toward the top surface of the substrate, with each contact and solder bump on the chip being positioned on the appropriate contact pad of the substrate. The assembly is then heated so as to liquefy the solder and bond each contact on the chip to the confronting contact pad of the substrate. Because the flip-chip arrangement does not require leads arranged in a fan-out pattern, it provides a compact assembly. The area of the substrate occupied by the contact pads is approximately the same size as the chip itself. Moreover, in flip-chip bonding, the contacts on the chip may be arranged in a so-called "area array" covering substantially the entire front face of the chip. Flip-chip bonding therefore is well suited to use with chips having large numbers of I/O contacts. However, assemblies made by flip-chip bonding are quite susceptible to thermal stresses. The solder interconnections are relatively inflexible, and may be subjected to very high stress upon differential expansion of the chip and substrate. These difficulties are particularly pronounced with relatively large chips. Moreover, it has been difficult to test a chip having an area array of contacts before attaching the chip to the substrate.

One solution has been the use of sockets or spring-like contacts to connect the bump leads to the substrate. As microelectronic chips have decreased in size, the pitch of the solder bump interconnections has become finer, requiring a finer pitch on mating sockets. At the same time, the mating sockets must still compensate for pitch error and height error in the solder bumps on the chip. Such accommodation for solder bump location tolerances becomes increasingly more difficult as the sockets are more tightly packed in a connector.

Sockets or contacts for connecting microelectronic elements to a substrate typically add considerable height to the chip package. Because packaging space is typically at a premium in all directions, there is a need for lower profile socket or contact connectors.

U.S. Pat. No. 3,795,037 to Luttmer discloses using a large number of separate, flexible gold wires extending through a resilient medium to a connection surface, at which the gold wires terminate. The gold wires are electrically connected on the opposite side of the resilient layer to leads in a substrate. When an array of bump leads is brought into contact with the connection surface, certain of the gold wires contact each of the bump leads, and provide conductors through the resilient layer. The resilient material and the gold wires flex upon contact by the bump leads, providing compliance.

U.S. patent application Ser. No. 08/511,131, assigned to the same assignees as the present application and hereby incorporated by reference herein, discusses sockets having metallic projections arranged circumferentially around a hole for receiving a bump lead. The metallic projections deflect as the bump lead is urged into the hole.

Kohn et al., U.S. Pat. No. 5,199,879 discloses a pin socket having a plurality of deflectable tabs projecting at least partially across an opening. Matsumoto et al., U.S. Pat. No. 4,893,172 and Noro et al., U.S. Pat. No. 5,086,337, disclose variants of the flip-chip approach using flexible spring-like elements connected between a chip and a substrate.

Nishiguchi et al, U.S. Pat. No. 5,196,726 discloses a variant of the flip-chip approach in which non-meltable bump leads on the face of the chip are received in a cup-like sockets on the substrate and bonded therein by a low-melting point material. Beaman, U.S. Pat. No. 4,975,079 discloses a test socket for chips in which dome-shaped contacts on the test substrate are disposed within conical guides. The chip is forced against the substrate so that the solder balls enter the conical guides and engage the dome-shaped pins on the substrate. Enough force is applied so that the dome-shaped pins actually deform the solder balls of the chip.

Rai et al, U.S. Pat. No. 4,818,728 discloses a first substrate such as a chip with studs or bump leads protruding outwardly and a second substrate with recesses having solder for engaging the bump leads. Malhi et al, U.S. Pat. No. 5,006,792 discloses a test socket in which a substrate has an exterior ring-like structure and numerous cantilever beams protruding inwardly from the ring-like structure. Contacts are disposed on these cantilever beams so that the same can be resiliently engaged with contacts of a chip when the chip is placed in the socket. Nolan et al, A Tab Tape-Based Bare Chip Test and Burn Carrier, 1994 ITAP And Flip Chip Proceedings, pp. 173–179 discloses another socket with cantilevered contact fingers for engaging the contacts on a chip; in this case the contact fingers are formed on a flexible tab tape and reinforced by a silicone material so as to provide forcible engagement and a wiping action with the chip contact.

Hill et al, Mechanical Interconnection System For Solder Bump Dice, 1994 ITAP And Flip Chip Proceedings pp. 82–86, discloses a test socket for flip chip devices with solder bumps. The socket has rough, dendritic structures on contact pads; here again, the chip with the solder bumps thereon is forced into the engagement with the rough, dendritic structures so as to make temporary contact for testing.

The reference "MCM to Printed Wiring Board (Second Level) Connection Technology Options" by Alan D. Knight, (in Multichip Module Technologies and Alternatives, ed. by Daryl Ann Doane and Paul D. Franzon, Van Nostrand, 1993, pp. 504–509 and pp. 521–523), together with the corresponding U.S. Patent of Evans et al, U.S. Pat. No. 4,655,519 and Grabbe, U.S. Pat. No. 5,228,861 disclose additional connection systems using deformable contacts. Despite all of these efforts in the art, however, there have still been needs for improved components for connecting semiconductor chips and other microelectronic components; for improved methods for connecting such chips and components and for improved systems which include the connected chips and components.

SUMMARY OF THE INVENTION

The present invention addresses these needs. One aspect of the invention provides a connecting assembly for connecting a microelectronic element having an array of bump leads comprises a substrate having electrically conductive leads, and a resilient, sheetlike body having first and second major surfaces. The second major surface faces the substrate and is spaced apart from the substrate. A support structure having gaps and solid portions extends between the second major surface of the sheetlike body and the substrate. An array of generally laminar contacts is secured to the first major surface of the body in registration with the array of bump leads on the microelectronic element to be mounted, and in alignment with the gaps in the support structure. Each of the contacts is surrounded by an associated portion of the sheetlike body, which is supported at its periphery by solid portions of the support structure. The portion of the sheetlike body is deflectable toward the substrate upon urging the bump leads on a microelectronic element against the corresponding contacts.

The resilience of the sheetlike body reduces the need for deflection of the metallic contacts themselves. Because the sheetlike material is more flexible than a standalone metallic contact, a contact of the invention may be smaller than an all-metallic contact having similar resilience. This makes possible a contact array having a finer pitch thus permitting a finer pitch of the bump leads on the microelectronic device.

In addition, the resilient, sheetlike body is less likely to plastically deform than an all-metallic contact. This permits the re-use of the connecting device of the invention as a test fixture that makes repeated, reliable connections with the microelectronic element.

The support structure may be an array of posts. In that embodiment, the array of posts may be electrically connected to the leads of the substrate and the contacts of the array may be electrically connected to the posts. In one embodiment, each of the deflectable portions of the body is supported by four posts. The array of contacts and the array of posts may be rectilinear arrays having row and column directions, wherein the posts are offset from the contacts in diagonal directions, oblique to the row and column directions. The posts may be solid core solder balls or may be conductive vias.

At least one post from the group of posts may electrically connect a respective contact to a lead on the substrate. The portion of the sheetlike body associated with the respective contacts deflects in response to downward forces exerted by a respective bump lead on the microelectronic element. The sheetlike body may have relief apertures in the portions associated with the contacts for increasing flexibility of the sheetlike body.

The contacts may be coated with solder in order to more readily bond with solder bumps on the microelectronic element. The connecting assembly may further comprise a conductive layer on the second major surface of the sheetlike body for controlling impedence. That layer may further include conductive traces for interconnecting the contacts, or the conductive traces may be used alone on the second major surface of the sheetlike body.

In applications where bonding is not desired between the contacts and bump leads on the microelectronic element, an anti-wetting agent may be deposited on the contacts.

The support structure may alternatively be a support layer wherein the gaps are holes, and an edge of a hole defines the periphery of the portion of the sheetlike body associated with a corresponding contact.

The sheetlike body may have a plurality of holes disposed in an array corresponding to the array of contacts, with the contacts extending inwardly over the holes. The contacts may have asperities protruding upwardly to contact the microelectronic element.

The connecting assembly may further have a frame for aligning the microelectronic element to the sheetlike body and a biasing structure for urging the microelectronic element against the sheetlike body.

In another aspect of the invention, a method is provided for making connections to the microelectronic element having an array of bump leads. A connector is provided having a sheetlike body, a substrate, an array of contacts on a first major surface of the sheetlike body, and an array of posts on a second major surface of the sheetlike body. The posts space the sheetlike body away from the substrate. Each of the contacts are on a portion of the sheetlike body having at its perimeter two or more of the posts.

The microelectronic element is aligned with the connector so that the array of contacts is in registration with the array of bump leads. The microelectronic element is then urged toward the sheetlike body so that the array of bump leads contacts the array of contacts, and each portion of the sheetlike body is resiliently deflected between two or more posts and a bump lead.

Each of the contacts may be electrically connected to one of the posts, and the posts may be electrically connected to the leads in the substrate, so that by urging the microelectronic element toward the sheetlike body, an electrical connection is made between the bump leads and the leads in the substrate.

After electrically connecting the leads to the substrate, the microelectronic element may be electrically tested through the electrical connection to determine whether the microelectronic element is acceptable. If the element is acceptable, the contacts may be bonded permanently to the bump leads.

In another embodiment of the invention, a connector is provided for mounting a microelectronic element to a substrate. The connector comprises a resilient, sheetlike body having first and second major surfaces, and a plurality of generally laminar contacts secured to the first major surface of the body. The contacts are disposed in an array corresponding to an array of bump leads on the microelectronic device to be mounted. Each contact is adapted to engage a corresponding bump lead. The connector further comprises an array of terminal posts on the second major surface of the sheetlike element. The terminal posts are electrically connected to the contacts. The terminal posts can thus be bonded to a substrate to electrically connect the contacts to the substrate, and to support the body with a stand-off space between the body and the substrate. To electrically connect the microelectronic element to the substrate, the microelectronic element is urged against the body so that bump leads on the element are engaged by contacts on the body, and portions of the body surrounding the contacts are resiliently deflected into the stand-off space.

The sheetlike body may have a plurality of holes disposed in an array corresponding to the array of bump leads on the microelectronic element, and each of the contacts may extend inwardly over one of the holes from the first major surface. Each contact may further include at least one projection extending over the hole associated with that contact. The contact may further include a plurality of projections extending inwardly from circumferentially spaced locations around the hole.

The connector may further have a protective layer formed over the leads. The terminal posts may be solid core solder balls.

The sheetlike body may have a plurality of holes corresponding to the terminal posts, the terminal posts being electrically connected to the contacts through the holes. The electrical connection may be made by a plurality of laminar contact tabs on the first surface of the sheetlike body.

The array of contacts and the array of terminal posts may be rectilinear arrays having row and column directions, and the terminal posts may be offset from the contacts in diagonal directions, oblique to the row and column directions.

The connector may further have support posts that are not electrically connected to any contact for further supporting the body.

In a further embodiment of the invention, a socket is provided for engaging a bump lead on a microelectronic element. The socket has a resilient, dielectric sheet with first and second major surfaces, and an electrically conductive contact secured to the first major surface of the sheet. The contact has an active contact portion. The socket further comprises a supporting substrate for the first surface, the substrate first surface being juxtaposed with the dielectric sheet's second major surface. The substrate first surface has a conductive terminal thereon. A plurality of posts are spaced around the active contact portion. The posts mechanically support a portion of the sheet surrounding the contact with respect to the substrate such that there is a gap between the sheet and the substrate. One of the posts electrically connects the terminal and the contact. The sheet deflects when the bump lead is engaged with the active contact portion of the contact.

An aperture may extend between the first and second major surfaces of the sheet. The active contact portion of the contact is aligned with the aperture and extends partially over the aperture.

The posts may be solid core solder balls, or may be vias. A spacer may be positioned between each of the posts and the first surface of the substrate, wherein the spacer electrically connects the post to the substrate and provides greater vertical height for deflection of the sheet. The spacer may include a laminar substrate having an aperture aligned with the active contact portion of the contact.

The socket may further comprise a second contact and a second plurality of posts mechanically supporting the second portion of the sheet surrounding a second active contact portion of the second contact. In this case, the first plurality of posts and the second plurality of posts have at least one post in common. The flexible sheet in that case may further include a conductive layer secured to the second major surface and interconnecting the first and second contacts.

The foregoing and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENT

Figure 9:
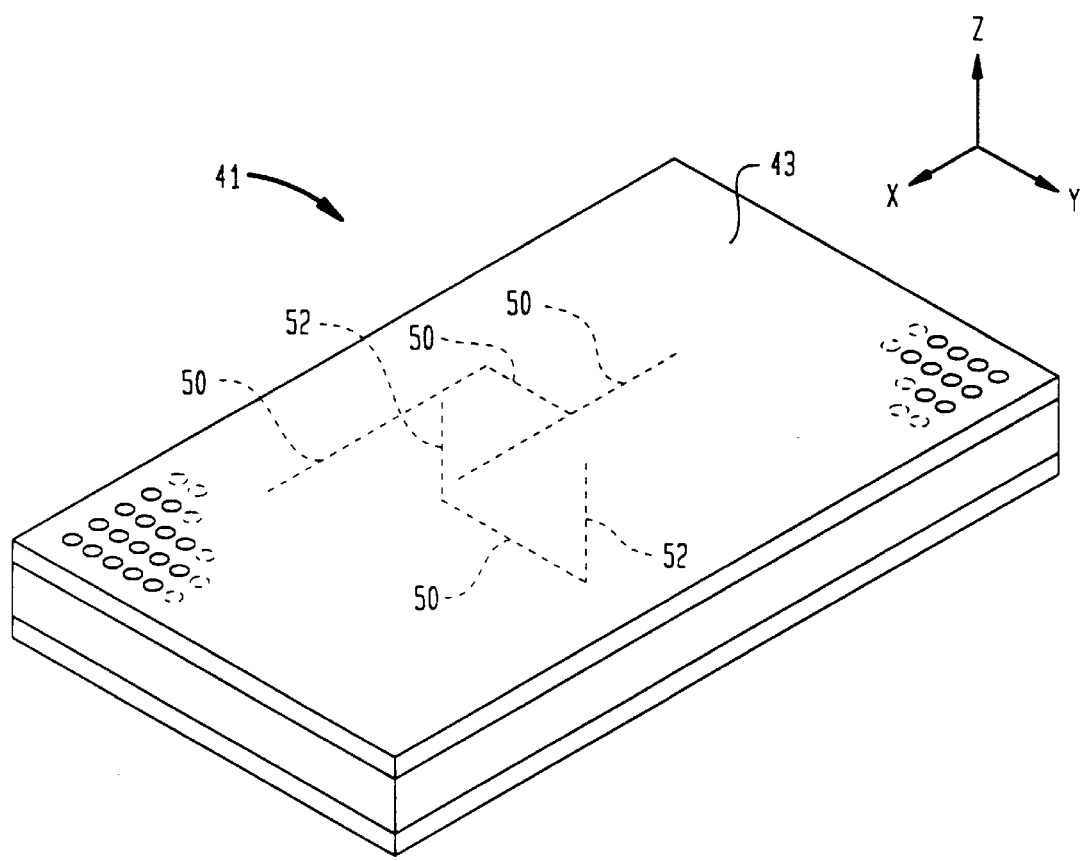
FIG. 9 is a diagrammatic perspective view of a substrate comprising a portion of a connecting assembly in accordance with one embodiment of the invention.

A connecting assembly 5 (FIG. 3) according to on e embodiment of the present invention includes a connector or interposer 10, a substrate 41 and a support structure with solid portions such as noncollapsible structural elements or posts 23 supporting the connector 10 above the substrate 41. The substrate 41 (FIG. 9) in this arrangement is a multi-layer laminated circuit panel with numerous electrical leads 50, of which only a few are schematically indicated. Leads 50 extend in mutually orthogonal, horizontal directions parallel to the top and bottom surfaces of the substrate. In accordance with 3 conventional semi-conductor industry practice, the horizontal directions are referred to as the "x" and "y" directions. Further, the direction 'upward' as used herein refers to the direction from the substrate toward the microelectronic element to be mounted, with the microelectronic element being 'above' or 'on top of' the substrate.

The substrate further includes vertical or z-direction leads 52 interconnecting the various horizontal leads 50. Some of the z-direction leads, as well as possibly some horizontal leads 50, are exposed at the top surface 43 of the substrate 41. These exposed leads are connected to terminals 42 (FIG. 3) disposed in a rectilinear grid of uniform pitch in the x- and y- directions. Terminals 42 may include, for example, flowable conductive materials such as solders, eutectic bonding alloys, polymeric materials with metallic fillers and the like, and they may also include structures such as vertically extensive vias. The substrate is formed principally from dielectric materials supporting and insulating the leads. Substrate 41 may also include other elements conventional in multi-layer circuitry, such as ground and power potential planes and the like.

A connector 10 according to the invention for connecting substrate 41 to a microelectronic element includes a sheet-like dielectric connector body 24 (FIGS. 1, 3) having a first surface 32 facing upwardly, away from the substrate 41, and a second surface 33 facing downwardly, toward the substrate. Thus, the second surface 33 of the sheetlike body 24 faces the top surface 43 of the substrate 41. According to the presently described embodiment, the sheetlike element 24 has numerous holes 27 extending through it from the first surface 32 to the second surface 33. The connector body 24 is desirably less than about 100 microns thick, and more desirably less than about 50 microns thick. In a preferred embodiment, the sheetlike element is between about 25 and 40 microns in thickness. To provide centering forces as further discussed hereinbelow, the diameter of the hole 27 should be slightly smaller than the diameter of the bump leads of the microelectronic element to be connected.

Figure 1:
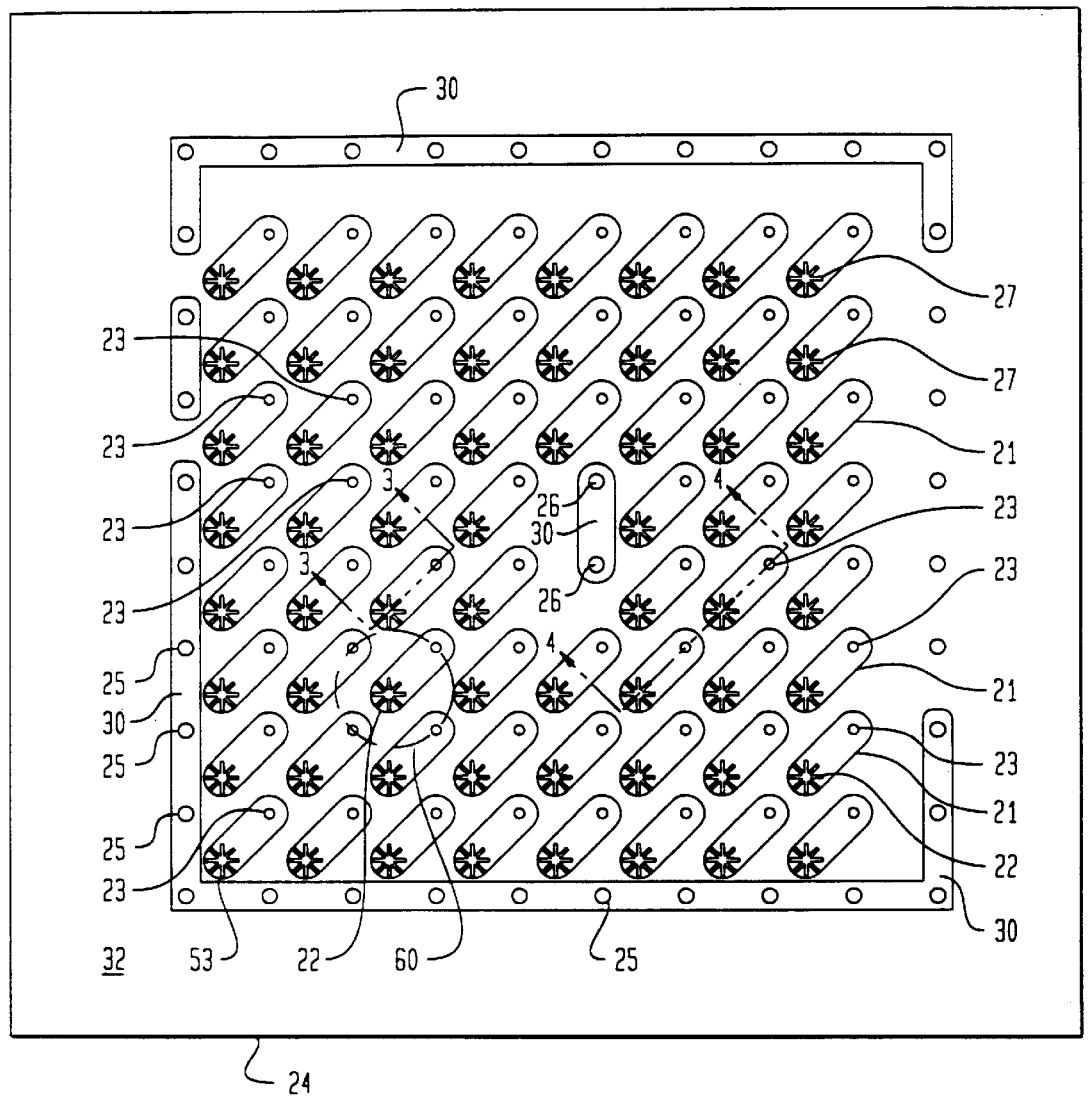
FIG. 1 is a diagrammatic plan view of a connecting assembly with connectors in accordance with one embodiment of the invention.
Figure 2A:
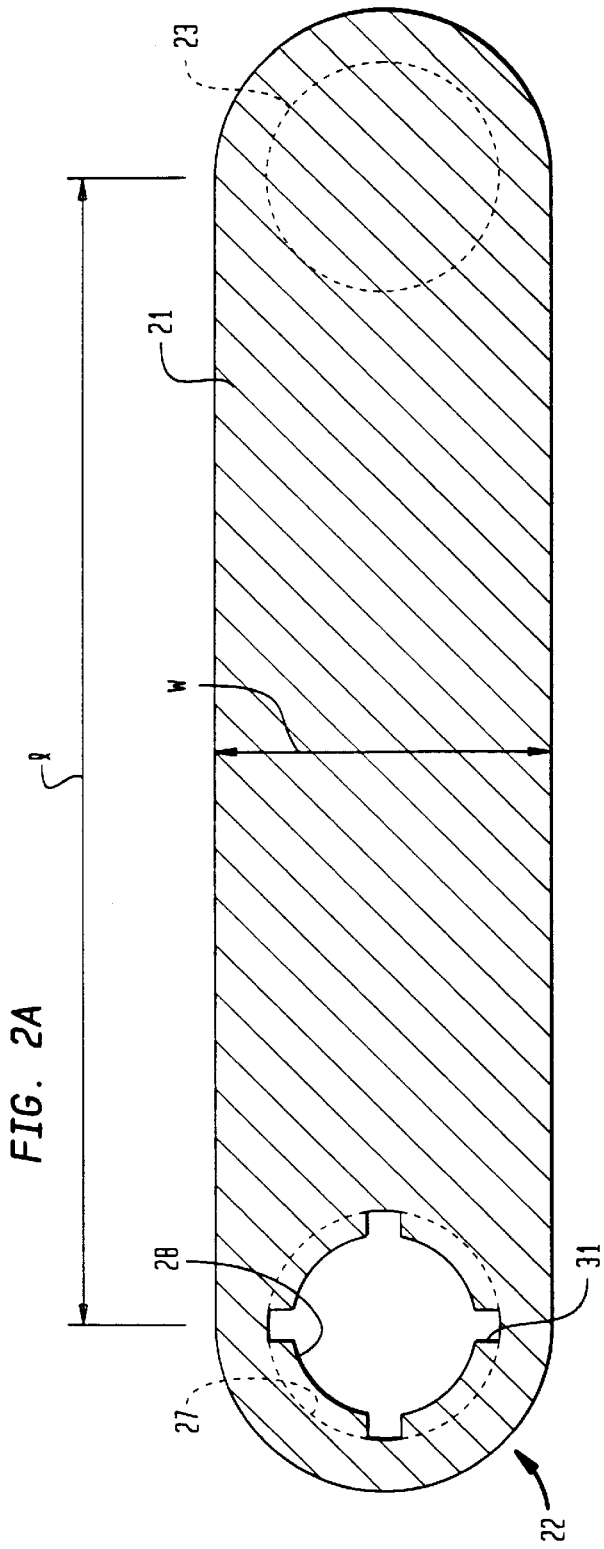
FIG. 2a is a fragmentary plan view depicting a portion of a connector for use in the connecting assembly of FIG. 1.
Figure 2B:
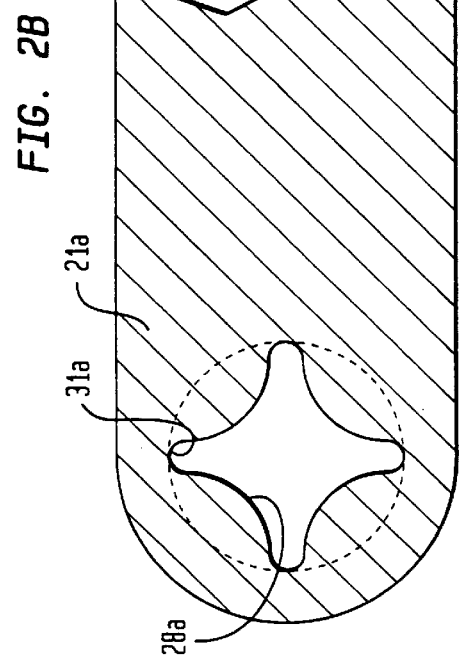
FIG. 2b is a fragmentary plan view depicting a portion of a connector of another embodiment for use in the connecting assembly of FIG. 1.
Figure 3:
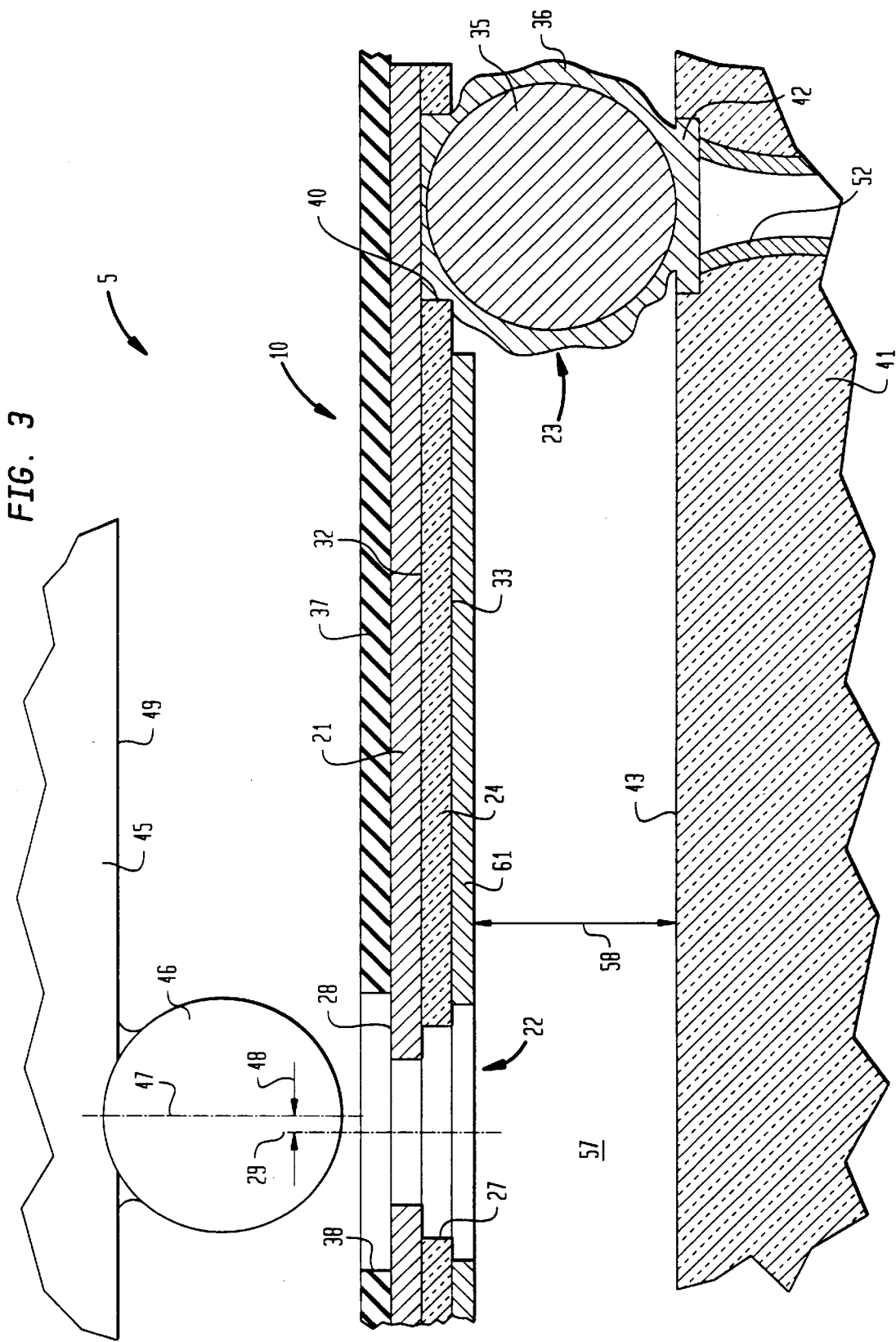
FIG. 3 is a partial cross-sectional view of the connecting assembly illustrated in FIG. 1 taken along line III—III, together with a microelectronic element to be mounted.

As shown in FIGS. 1–3, an elongated metallic contact tab 21 is associated with each hole 27. Each contact tab overlies the first surface 32 of the connector body 24. Each contact tab includes an active contact portion 22 comprising a ring-like structure at one end of the tab 21 encircling the opening of the hole 27, and a plurality of projections 28 extending inwardly from the ring-like structure. The projections 28 protrude over the opening of the hole 27 (FIG. 29). The projections are separated from one another by slots 31 (FIG. 2a). The projections 28 of each contact tab 21 cooperatively define the active contact portion 22 overlying the hole 27.

The holes 27 and the associated contact tabs 21 are arranged on the top surface 32 of the sheetlike body 24 in a rectilinear grid array, as shown in FIG. 1. The grid array of active contact portions 22 corresponds with a grid array of contacts such as solder bumps 46 (FIG. 3) on a microelectronic element 45 to be connected.

Each contact tab 21 extends to a noncollapsing structural element or post 23 connected to the contact tab 21 through the sheetlike body 24. In a preferred embodiment, holes 40 (FIG. 3) are provided in sheetlike body 24, exposing an undersurface of the contact tabs 21. The posts 23 are bonded directly to the contact tabs 21 through the holes.

As seen in FIG. 1, the active contact portions 22 and the holes 27 are arranged in rows extending in the x-direction and columns extending in the y-direction. Each contact tab 21 is arranged at an oblique angle, at 45 degrees to the x-direction (and hence 45 degrees to the y-direction), so that each post 23 is offset in this oblique direction from the active contact portion 22 and hole 27. Thus, the posts 23 are also arranged in a rectilinear array of rows and columns extending in the x- and y- directions, but this array is offset from the array of holes 27 and active contact portions 22.

The pitch or spacing of the posts 23 on the connector 10 matches the spacing of the terminals 42 on the top surface 43 of the substrate 41. The posts 23 are bonded to the z-leads 52 (FIG. 3), making an electrical and mechanical connection between the contact tabs 21 in the connector 10 and the leads 50, 52 in the substrate 41.

The rectilinear arrays can have essentially any pitch or spacing between adjacent elements. Preferably, however, the pitch of each array is a pitch which corresponds to a standard pitch for contacts on the surfaces of microelectronic elements such as semi-conductor chips having "array area" contacts. Microelectronic elements having contacts with a pitch of about 0.5 mm or less between adjacent elements as measured along a row or along a column are known.

Contact tabs 21, and the projections 28 incorporated therein, are generally laminar. As used in this disclosure, the term "laminar" means sheet-like or plate-like. That is, a laminar structure has two oppositely-directed major faces and has edges, the major faces having surface areas substantially greater than the surface areas of the edges. A laminar structure is not necessarily planar. For example, the laminar structures may have bumps or asperities projecting upwardly from their top surfaces. Contact tabs 21 may be formed from metallic materials, preferably those having good electrical conductivity and good processing properties in etching and plating processes such as those commonly used for microelectronic components. Materials which can be used include copper and copper bearing alloys such as beryllium copper and phosphor bronze. The metal of the contact tab and of the projection is between about 10 and 50 microns thick, and more desirably between about 10 and 25 microns thick. Standard lithographic processing techniques may be used to fabricate the contact tabs. The dimensions of the components will vary somewhat depending upon the pitch selected and the nature of the microelectronic components to be engaged with the connector. However, for a system having a pitch of about 0.75 mm, the width w of each contact tab (FIG. 2a) is about 0.45 mm, whereas as the length l between the center of the active contact 22 and the center of the post 23 may be about 0.53 mm. The hole in the sheetlike element 24 below the active contact area 22 is about 0.35 mm in diameter, and the projections 28 extend over the hole 27 approximately 50 microns per side.

The contact tabs 21 are preferably covered by a solder mask or coverlay layer 37 (FIG. 3) to protect the underlying copper tabs during bonding to a microelectronic element 45 so that solder from the connection is not wicked away by the tab 21, and so that adjacent tabs are not bonded together. The coverlay layer 37 also protects the underlying copper tabs during testing of a microelectronic element in the event that solder in the microelectronic element liquefies during testing. The coverlay 37 has a hole 38 in the active contact area 22 to expose the overlying projections 28 of the metallic contact tabs 21.

The contact tabs 21, including the overlying projections 28, may further be covered with an anti-wetting agent. For example, osmium, rhodium, rhenium, graphite or another suitable substance may be electroplated onto the contacts 22 (or possibly the projections 28 only) in order to prevent solder from wetting the contacts. The anti-wetting agent permits the connector assembly to be used as a socket for burn-in and testing of a microelectronic element at high test temperature ranges, which may be as high as 150° C. Under these conditions, solder in the bump leads may liquefy or soften, and may bond to the contacts in the absence of an anti-wetting agent.

On the other hand, it is desirable to encourage solder wetting of the contact tabs 21 in those embodiments wherein a permanent solder joint is to be formed between the bump leads 46 of the microelectronic element 45 and the connector 10. In that case, the projections 28 of the contact tabs 21 are tinned or coated with solder in order to facilitate solder joining to the mating bump leads 46. The mechanical and electrical connections between the microelectronic element 45 and the contact tabs 21 are made permanent by cycling the assembly including the microelectronic element and the connector through a soldering temperature cycle. During the soldering process, the solder that is initially on the projections 28 is melted and flowed onto the bump leads 46 of the microelectronic element. The solder wets the projections 28 of the contacts and joins them to their respective bump leads, allowing the projections to penetrate the bump leads in the case where the bump leads 46 comprise a flowable solder ball, such as eutectic Sn-Pb solder.

A ground or power plane layer 61 may be provided on the bottom surface 33 of the flexible sheet 24, as shown in FIG. 3. Such a layer comprises a solid layer covering all or substantial portions of the bottom surface 33 of the flexible layer 24. Depending on the requirements of the individual connector, the layer 61 may comprise a ground layer in some regions of the connector, and a power plane layer in other regions of the connector, wherein the regions are electrically isolated by gaps in the layer 61. The layer 61 may be used to control impedance in the microelectronic element 45 and in the connector 10 and substrate 41.

Alternatively, the layer 61 may comprise a plurality of conductive traces that electrically interconnect selected contacts in a test pattern, or for providing additional interconnections supplementing those in the substrate 41. In one example of such an embodiment, conductive traces within the layer may be used for connecting two or more posts 23 with a single solder bump 46 on a microelectronic element. This may be done by directly interconnecting the posts 23 using conductive traces in the layer 61. Alternatively, the leads 21 could be interconnected to the conductive traces by vias (not shown) through the flexible layer 24. In either case, a significant quantity of test circuitry may be included in the layer 61 for the testing of a microelectronic element 45. Finally, the layer 61 may comprise a combination of interconnecting conductive traces in certain areas where such traces are needed, and ground or power plane regions in other areas where interconnecting conductive traces are not needed.

The post 23 preferably comprises a solid core solder ball having a solid core 35 of an electrically conductive, relatively high-melting-point material such as copper or nickel, surrounded by a layer of electrically conductive, heat activatable bonding material 36 such as solder. By making the connection between the connector 10 and the substrate 41 using an array of solid core solder balls, standard ball grid array processes and equipment may be used to assemble those components.

Thus, when the posts 23 are bonded to the contact tab 21 and to the leads 52 in the substrate 41, the solid core 35 remains intact, forming a standoff space 57 (FIG. 3) between the top surface 43 of the substrate 41 and the second surface 33 of the sheetlike element 24. The standoff space 57 has a predetermined thickness 58 established by the size of the noncollapsing portion of the post 23; i.e., by the diameters of cores 35.

Figure 16:
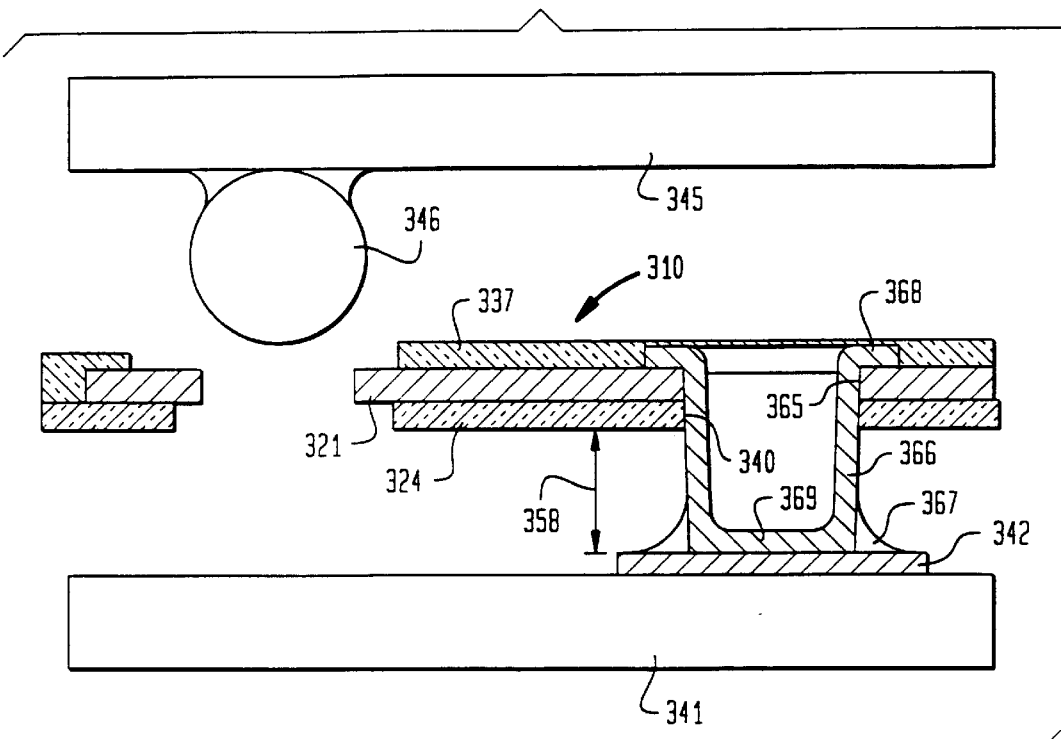
FIG. 16 is a diagrammatic sectional view of a connecting assembly according to another embodiment of the invention, together with a microelectronic element to be mounted.

In another embodiment of the invention shown in FIG. 16, a via 366 is used in place of the solid core solder ball to form a post. The via 366 comprises a hollow, substantially cylindrical or hourglass-shaped post formed from copper, gold, other conductive material or alloys thereof. The via may alternatively be shaped as another surface of revolution, such as a cone or a barrel-shaped element. The via 366 extends through an aperture 365 in the contact tab 321, and through an aperture 340 in the flexible sheet 324. The via terminates above the contact tab 321 with a flange 368 in contact with the tab. The tab and the via are in electrical contact. The via extends downward below the flexible sheet 324 a fixed distance 358, which establishes the stand-off distance between the connector 310 and a substrate 341. The via 366 terminates in a lower wall 369 to form a cup-shaped element. In use, the connector 310 is connected to the substrate 341 by soldering an array of vias 366 onto a corresponding array of terminals 342 on the substrate 341.

Vias, such as via 366, may be formed by using a sacrificial layer (not shown) of resist or other suitable material. The sacrificial layer has an aperture in registry with the aperture 340 in the flexible layer 324 and the aperture 365 in the contact tab 321. The three apertures are formed concurrently in order to assure alignment. After forming the apertures, an additional sacrificial layer (not shown) is applied over the first sacrificial layer in order to form a lower wall 369 in the via 366. After appropriately masking the upper surface of the contact tabs 321, the via is formed in a conventional manner by plating the sides and bottom of the aperture, together with a small area surrounding the aperture on the contact tab 321. The sacrificial layers are then removed, leaving the residual via 366. A solder mask layer 337 may be formed over the contact tab 321 and upper flange 368 of the via 366.

Figure 17:
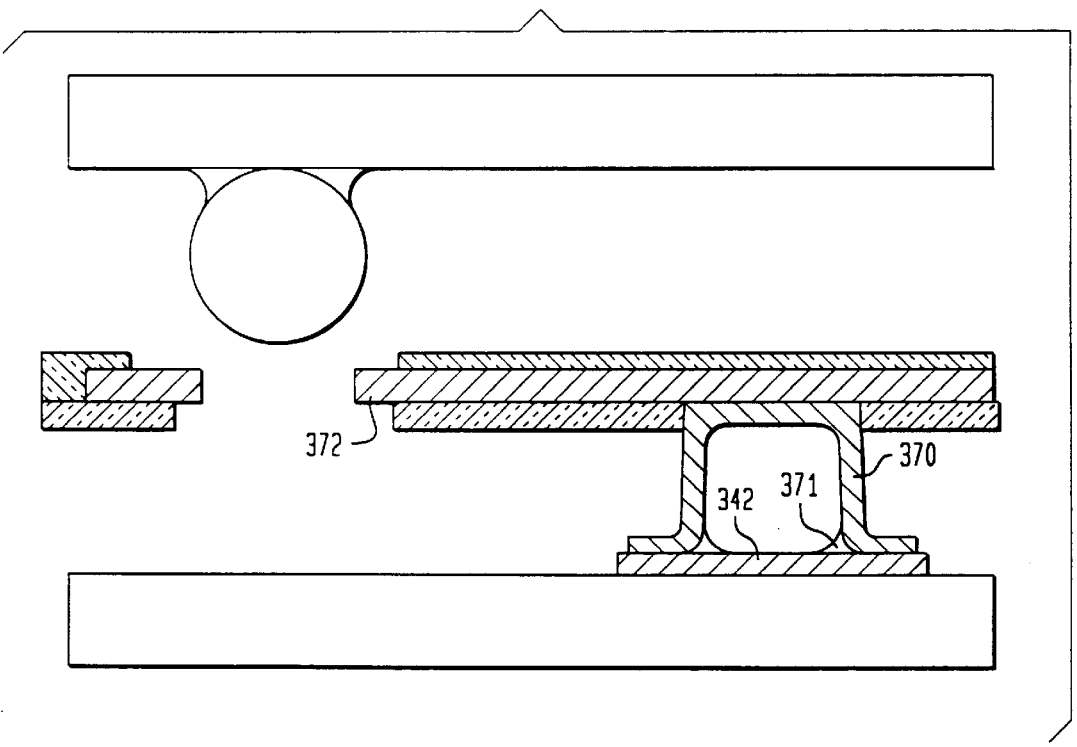
FIG. 17 is a diagrammatic sectional view of a connecting assembly according to another embodiment of the invention, together with a microelectronic element to be mounted.

In another version of the connector, shown in FIG. 17, the via 370 is inverted with respect to the embodiment of FIG. 16. In this embodiment, no aperture is necessary in the contact tab 372, and only a single sacrificial layer (not shown) need be formed in order to form the via 370. The via 370 is formed by plating an aperture in the sacrificial layer from the side opposite the contact tab 372.

While the embodiments of FIGS. 16 and 17 incorporating a via as a post have good structural integrity, additional resistance to crushing in the z-direction may be provided by filling the via with solder, or any other suitable material. In the embodiment shown in FIG. 17, the solder 371 also provides a bonding material for bonding to substrate terminal 342. Alternatively, a more compliant material may be placed within the via in order to prevent crushing or buckling of the via walls while at the same time providing some resilience to absorb thermal cycling and other forces. For example, a polymer, a high durometer elastomer, a conductive elastomer or other suitable material may be provided within the via.

Each of the contact tabs 21 is connected to a lead 52 in the substrate 41 through one of the posts 23 as described above. Additional noncollapsing structural elements 25, 26 (FIG. 1), that do not serve as conductors, may also be provided in order to further support the connector 10 above the top surface 43 of the substrate 41. For example, some contact tabs may be omitted at locations where the microelectronic package is missing bump leads. In such a location in the regular grid pattern of the connector 10, non-collapsing structural elements 26 may be provided solely for the purpose of supporting the connector 10. Further, additional noncollapsing structural elements 25 may be provided around the periphery of the grid array of contact tabs 21 in order to provide support for the connector 10 at the periphery. Additional metal elements 30 formed from the same thin metal as the contact tabs may be provided on the connector above each additional noncollapsing structural element 25, 26, in order to provide a bonding surface for the post. The additional metal elements 30 may be formed as one or more large linear elements or buses.

Figure 4:
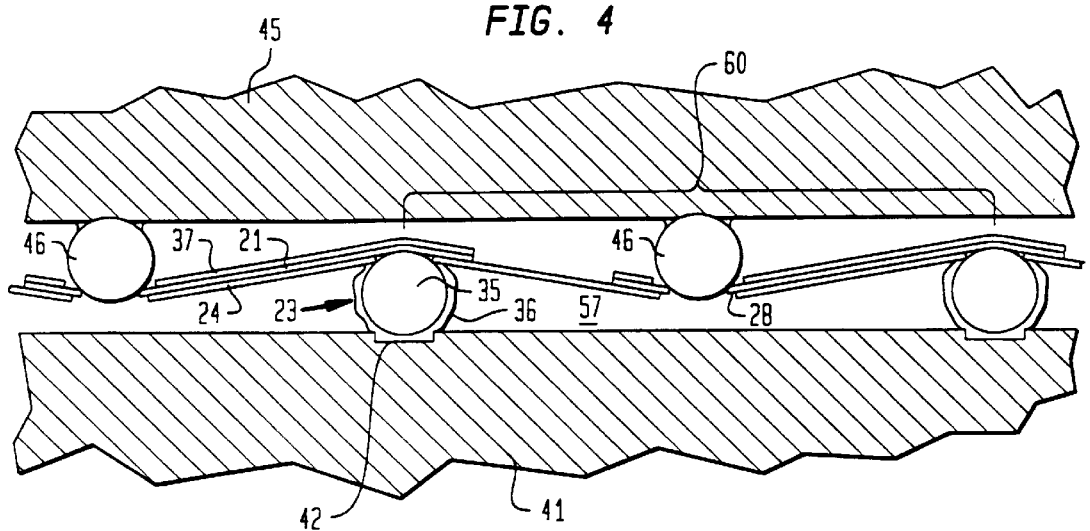
FIG. 4 is a diagrammatic sectional view of the connecting assembly shown in FIG. 1 taken along line IV—IV, together with a microelectronic element to be mounted.

Each active contact portion (or 'contact') 22 of the grid array of FIG. 1 is located at the center of a surrounding portion 60 of the resilient connector 10, which, in turn, is supported by four posts (FIGS. 1, 4). Even the corner socket 53, shown in the lower left hand corner of FIG. 1, is disposed within an array of three peripheral posts 25 and a post 23 associated with the corner socket 53. Other grid array systems, wherein each active contact portion 22 is supported by two, by three, by four or by five or more posts 23, may also be employed. Thus, a single post typically provides an electrical connection for a socket and mechanical support for a plurality of adjacent sockets.

In a connection method according to the invention, a microelectronic element such as element 45 (FIGS. 3, 4) is engaged with the connector assembly 5. The microelectronic element 45 has a plurality of bump leads 46, each protruding from the bottom surface 49 of the element 45. The bump leads are disposed in a rectilinear grid having the same pitch as the grid of active contact portions 22 (FIG. 1). In this regard, although the bump leads should be dispersed only at the locations defined by such grid, there is no requirement that a bump lead be present at every such location. That is, the grid of bump leads need not be fully populated. For example, the bump leads may be disposed at every other location, every third location and so forth, so that the populated bump lead locations have an effective pitch of 2, 3 or some other integral multiple of the pitch of the holes in the connector.

Each bump lead 46 is in the form of a generally spherical ball, similar in construction to posts 23, electrically connected to the internal circuitry of the element 45. Each bump lead may include an internal sphere or core formed from an electrically conductive, relatively strong metal such as copper or nickel. Each sphere, in turn, is covered with a layer of electrically conductive, heat activatable bonding material such as solder.

Microelectronic element 45 is engaged with the connecting assembly 5 by bringing the microelectronic element 45 into proximity with the connecting assembly so that the contact bearing surface 49 of the element 45 is juxtaposed with the top surface 32 of the sheetlike element 24. The microelectronic element 45 is positioned so that the array of bump leads 46 is in rough registration with the array of active contact portions 22 of the contact tabs 21 (FIG. 3). The microelectronic element 45 is then urged downward so that the bump leads 46 contact the projecting portions 28 of the contact tabs 21. The metal corners of the projections 28 contact and wipe against the solder bump 46. While scraping or wiping contact between the projections 28 and the solder bump 46 may not be necessary to electrically connect the two components, it increases reliability by penetrating any oxide layer that may have formed on the connecting surfaces.

As downward motion of the microelectronic element 45 relative to the connecting assembly 5 continues, connector 10 is deflected between the solder bumps 46 and the non-collapsing structural elements 23 (FIG. 4). The sheetlike element 24 resiliently deforms, with each solder bump 46 resiliently deflecting a surrounding portion 60 of the sheetlike element 24 downward into the standoff space 57 between the sheetlike element and the substrate 41.

Each portion 60 surrounding an active contact area 22 on the connector 10 has, at its periphery, a group of at least two, and more preferably three, supporting posts 23. In the currently most preferred embodiment, shown in FIG. 1, the periphery of surrounding portions 60 includes a group of four posts 23. As the surrounding portion 60 of the sheetlike element 24 is deflected into the standoff space 57, the sheetlike element is stretched. The posts force the sheetlike element 24 upward, and the bump leads 46 force the sheetlike element downward. The resilience of the sheetlike element 24 maintains contact between the protruding portions 28 of the contact tab 21 and the bump lead 46.

The resilience of the sheetlike element provides tolerance for misalignment and position errors in the array of bump leads 46, and in the array of active contacts 22. For example, as shown in FIG. 3, the centerline 47 of the bump lead 46 may not be properly aligned with the center line 29 of the active contact 22. The misalignment 48 is accommodated by asymmetric deflection of the surrounding portion 60 of the sheetlike element 24. The resiliency of the sheetlike element also compensates for unevenness in the heights of the individual bump leads 46 on the microelectronic element 45.

Furthermore, some self-centering forces are exerted on the bump leads 46 as a result of the socket-like qualities of the active contacts 22. Thus, a slightly misaligned microelectronic element will be urged to a position wherein the bump leads are better aligned with the active contacts 22 as the microelectronic element is forced downward onto the connector 10.

Because resiliency in the connector 10 results from a resilience of the sheetlike element 34 in addition to elastic deformation of the metallic contact tabs 21, the connector 10 is less likely to be plastically deformed through use than are connectors of the prior art. For this reason, the connector 10 and connecting assembly 5 are particularly suitable as reusable test fixtures for testing microelectronic elements. The connector assembly 5 may also be used as a permanent mount for microelectronic elements, by activating the bonding component of the bump leads 46, permanently bonding the microelectronic element to the connector assembly 5.

The connector of the invention is especially suited for testing and then selectively bonding microelectronic elements during the assembly process. In this application, the microelectronic element is first urged against the connector of the invention using a first force $F_1$, sufficient to make contact between each bump lead and a corresponding socket. The microelectronic element is then tested. If the microelectronic element is rejected, it is removed from the connector and replaced with another microelectronic element. If the microelectronic element passes the test, it is then urged against the connector with a second force $F_2$, greater than force $F_1$, that actually inserts each bump lead into a respective socket. The bump lead may then be bonded to the connector, without interrupting contact between the connector and the microelectronic element. A connector having a somewhat larger aperture 27 in the dielectric layer is provided for this application, in order to permit the bump lead to penetrate the socket. The connector assembly of the invention is especially suited for this application because of its low profile as compared with typical test fixtures, making is suitable as a permanent connector for the microelectronic assembly.

Figure 15:
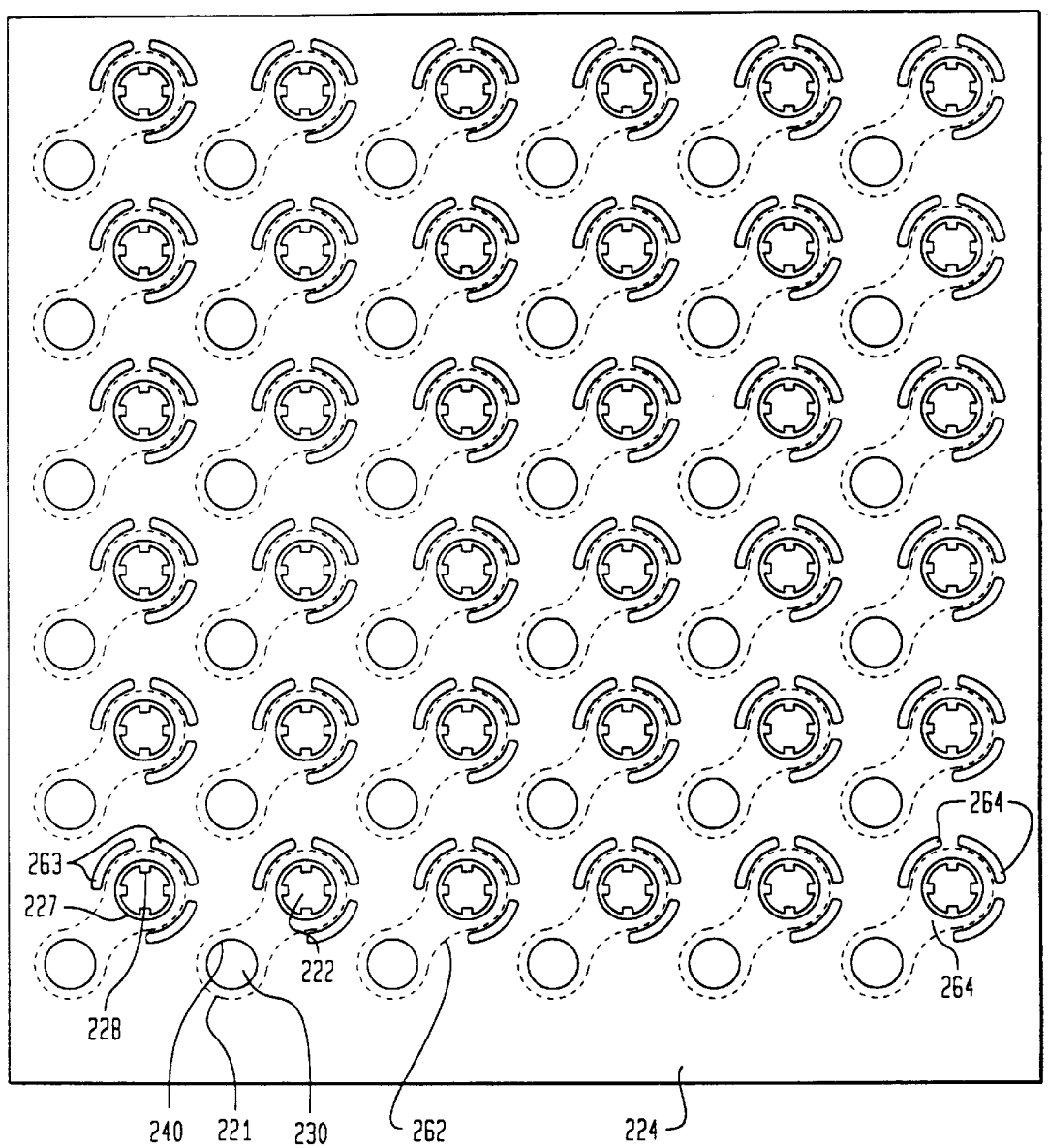
FIG. 15 is a diagrammatic plan view of a connecting assembly with connectors in accordance with another embodiment of the invention.

In another embodiment of the invention, shown in FIG. 15, a connector 210 has a flexible layer 224 with a grid array of holes 227, and a corresponding array of contact tabs 221 in registry with the holes 227. In an active contact portion 222 of each contact tab 221, a plurality of projections 228 extends inwardly, protruding over the opening of the hole 227. The contact tabs are generally elongate, and further have a connection portion 230 extending over a hole 240 in the flexible sheet 224. The hole 240 exposes the connection portion 230 for connecting the contact tab 221 to a post (not shown) as described above.

The flexible sheet 224 is further provided with a plurality of arcuate slots or relief apertures 263 surrounding the active contact portion 222. The arcuate slots define bridges of the flexible layer 224 between the slots for providing support to the areas surrounding the active contact portion 222. The arcuate slots 263 provide additional flexibility and elasticity to the flexible layer 224 in the immediate vicinity of the active contact portions 222. Such additional flexibility permits relative movement of the individual contact portions 222 during engagement with solder bump leads on a microelectronic element, and during thermal cycling of the substrate and the microelectronic element.

The contact tab 221 further comprises a necked-down portion 262 between the active contact portion 222 and the connection portion 230 of the contact tab 221. The necked-down portion allows closer placement of the surrounding arcuate slots 263, and reduces the cross sectional area of the stiffer contact tab 221. Both of these effects increase the flexibility of the region of the connector 210 immediately surrounding the active contact portion 222.

The contact tab may have other configurations than that shown in FIG. 2a. For example, a contact tab 21a (FIG. 2b) may have rounded overlying projections 28a separated by rounded slots 31a. The gradually curved features of this embodiment have increased manufacturability because of the natural tendency of photolithography and etching processes to produce rounded corners.

Figure 5:
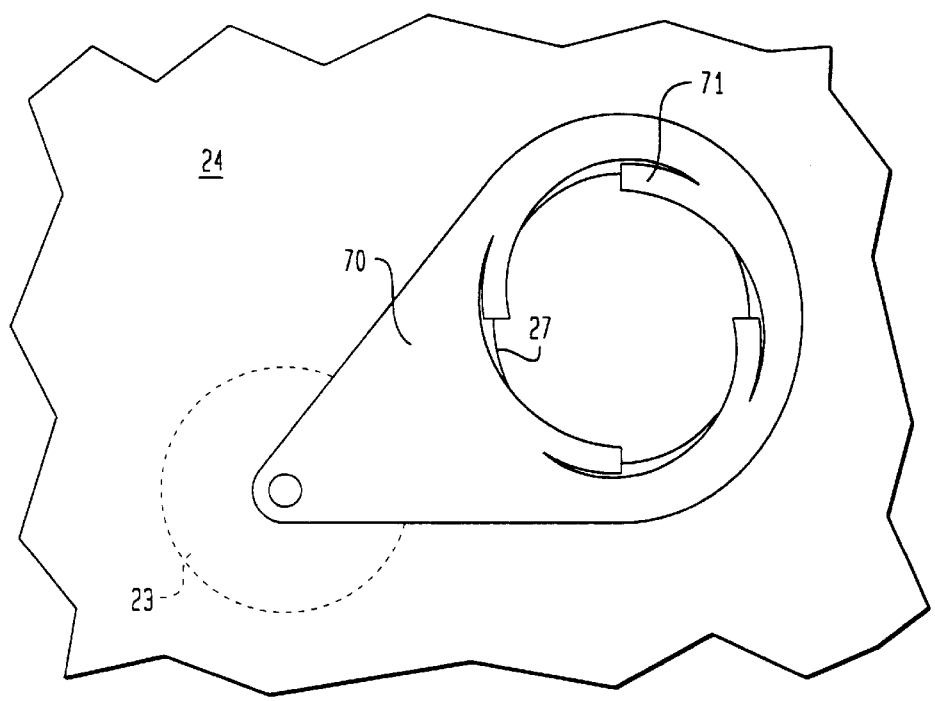
FIG. 5 is a schematic plan view of a connector in accordance with another embodiment of the invention.

In another example, contact tab 70 (FIG. 5) increases in width from a relatively small width where it makes contact with the post 23 to a relatively large width to surround the hole in the flexible sheetlike element 24. The projections 71 comprise curved arms configured to scrape the bump lead as the bump lead is forced downward toward the sheetlike element 28. Other contact projection configurations and contact tab geometries may also be used as is known in the art.

Figure 10:
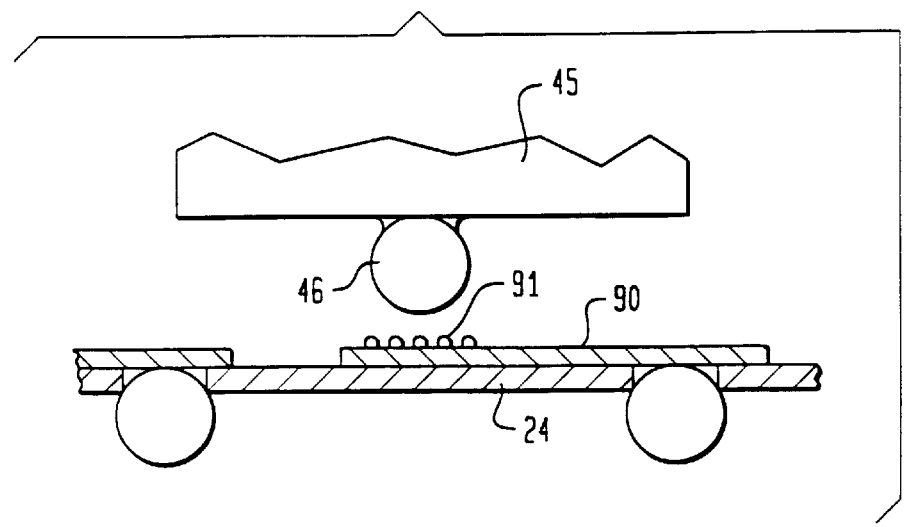
FIG. 10 is a diagrammatic sectional view of a connecting assembly according to another embodiment of the invention, together with a microelectronic element to be mounted.

The contact tab may have features in addition to or in place of contact projections in order to enhance contact between the contact tab and the solder bump of the microelectronic element. For example, contact tab 90 (FIG. 10) has asperities 91 facing upward away from the sheetlike body 24. Such asperities are described in commonly assigned U.S. Pat. No. 5,632,631, which is hereby incorporated in its entirety herein. The asperities 91 may have sharp edges or corners on upper surfaces thereon. As the microelectronic element 25 is urged against the connector, the asperities 91 penetrate any oxide coating that may exist on the solder bump 46, providing a reliable electrical connection. The resiliency of the sheetlike layer 24 assures that contact is made between each of the solder bumps 46 and the associated asperities on the connector. In certain applications, such as the embodiment shown in FIG. 10, the hole in the active contact region through the sheetlike element 24 may be eliminated. Asperities may alternatively be used in conjunction with projecting portions of the contact extending over a hole in the sheetlike body 24.

Figure 11:
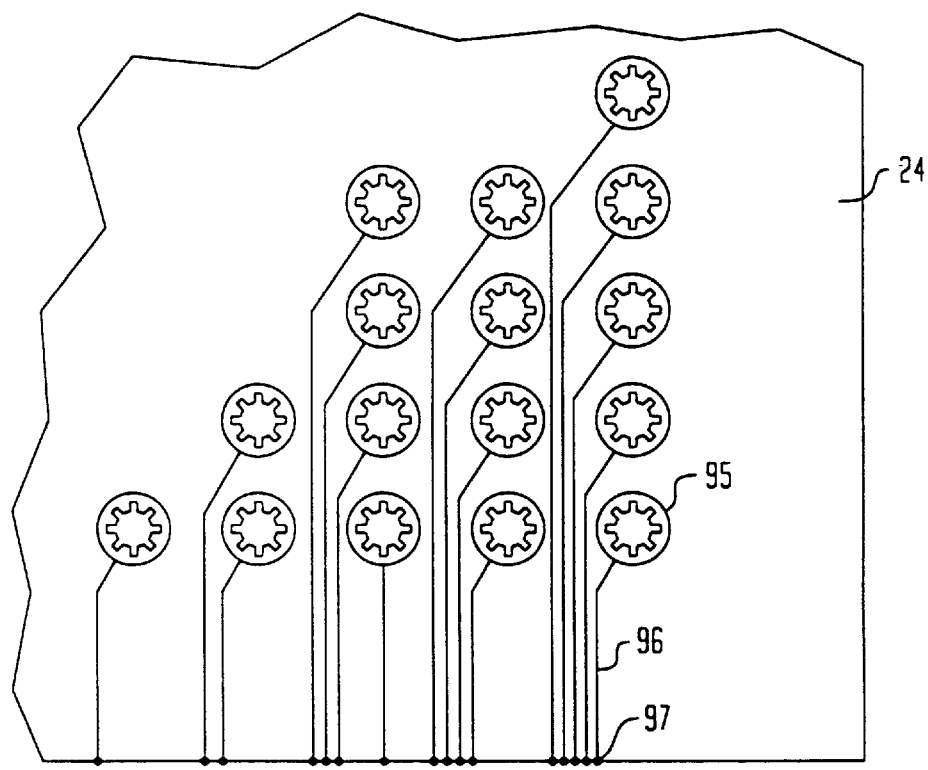
FIG. 11 is a diagrammatic plan view of a connecting assembly with connectors in accordance with another embodiment of the invention.

Electrical connection between the contact tabs and the substrate need not be made through one of the posts 23 near that active contact. Instead, circuit traces 96 (FIG. 11) on the sheetlike element 24 may lead to contacts 97 on the periphery of the sheetlike element 24, where electrical connections between the substrate and contacts 95 may be made.

Figure 12:
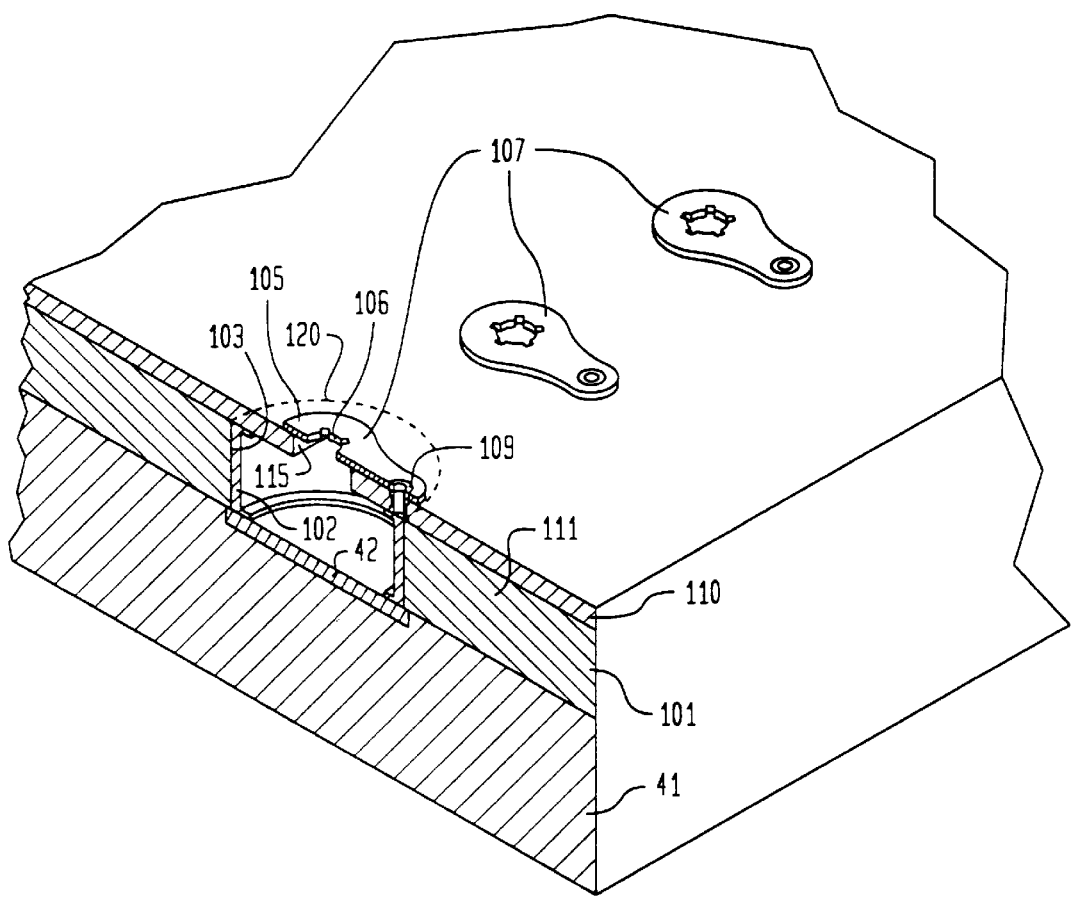
FIG. 12 is a perspective, diagrammatic partial cross-sectional view of a connecting assembly according to one embodiment of the invention.

In another embodiment of the invention, the support structure is a support layer 101 (FIG. 12) between the sheetlike body 110 and the substrate 41. The support layer may be a dielectric such as polyimide or another suitable material. The support layer 101 has gaps such as hole 103, and solid portions 111. Active contact portions 105 of the contact tabs 107 are located immediately above the holes 103 in the support layer 101. The perimeter of the hole 103 defines a portion 120 of the sheetlike body 110 associated with an active contact portion 105. Upon contact with a solder bump (not shown), the active contact portions 105 move into the hole 103 as the associated portion 120 of the sheetlike element 110 deflects downward.

Electrical connection is made between the active contact portion 105 and terminals 42 in the substrate 41 by connecting the contact tab 107 to a via 109 in the sheetlike body 110. The via 109 has an electrical conductor extending therethrough, making electrical contact with a ring-like electrical conductor 102 which may be formed by plating the inside of the hole 103 in the support structure 101. The ring-like structure 102 electrically connects the via 109 with the terminal 42 in the substrate 41.

A hole 115 in the flexible sheet 110, in combination with protruding portions 106 of the active contact area 105, provide for wiping/scraping of the solder bumps as the contact is deflected downward.

Figure 13:
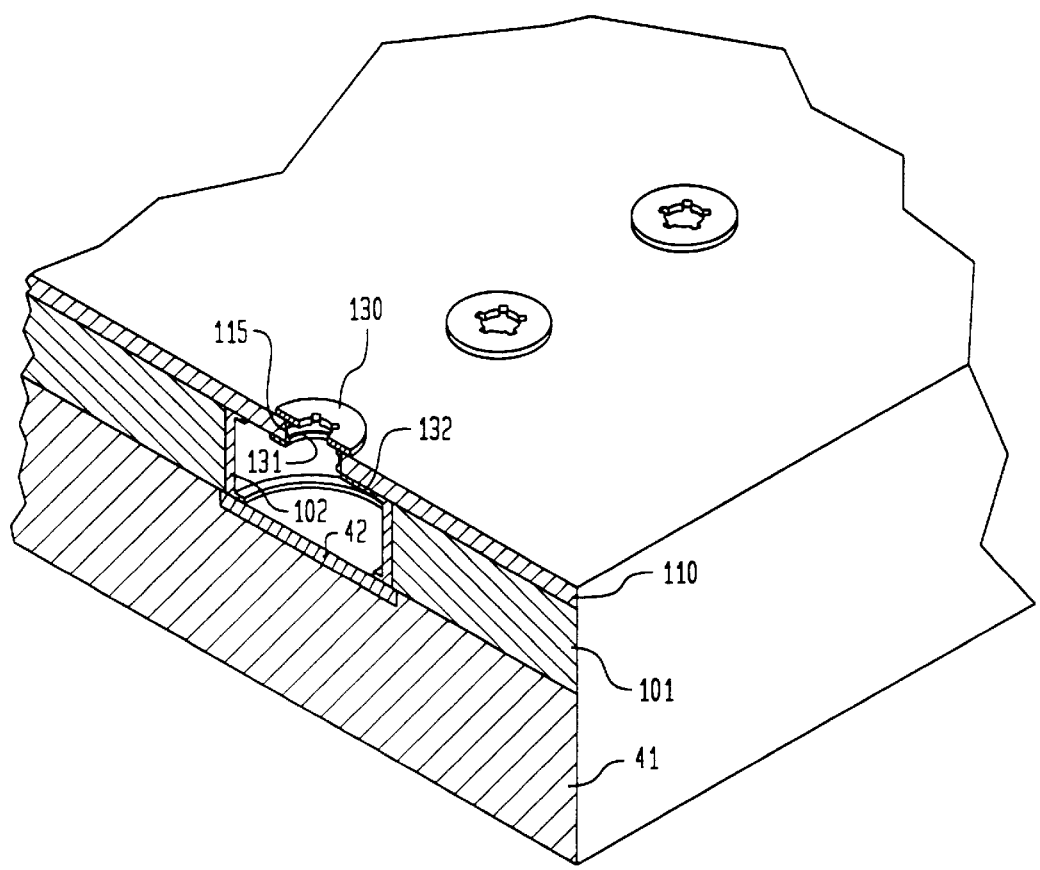
FIG. 13 is a perspective, diagrammatic partial cross-sectional view of a connecting assembly according to another embodiment of the invention.

In another embodiment of the invention (FIG. 13), the support layer 101 has a metallic, ring-shaped conductor 102 connected to a terminal 42 in the substrate 41 as described above. The electrical connection between the contact tab 130 and the conductor 102, however, is made through the hole 115 to connect in the sheetlike element 110. A conductor 131 is formed in the hole 115, for example by plating, to connect the contact tab 130 with a lead 132 on the second surface of the sheetlike element 110, opposite the contact tab 130. Electrical contact is therefore made between the contact tab 130 and the terminal 42 through the conductor 131, the lead 132 and the conductor 102.

Figure 14:
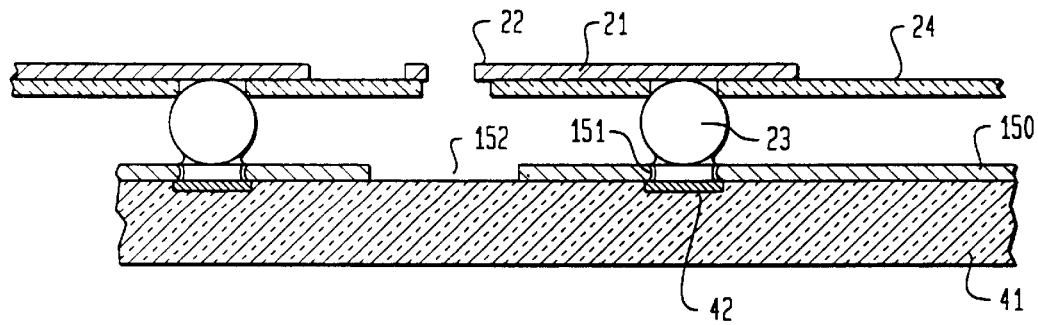
FIG. 14 is a diagrammatic partial cross-sectional view of a connecting assembly according to another embodiment of the invention.

Additional travel for deflection of the sheetlike element 24 may be provided by spacing the support structure such as posts 23 away from the substrate 41 using a glue layer or other spacing layer 150 (FIG. 14). The spacing layer 150 has a hole 152 in registry with the active contact portion 22 of the contact tab 21. When a solder bump (not shown) deflects the sheetlike layer 24 toward the substrate 41, the hole 152 provides additional clearance for additional downward travel. Similar results may be had by forming the hole 152 directly in the substrate. Such a configuration further reduces the height of the total assembly.

Figure 6:
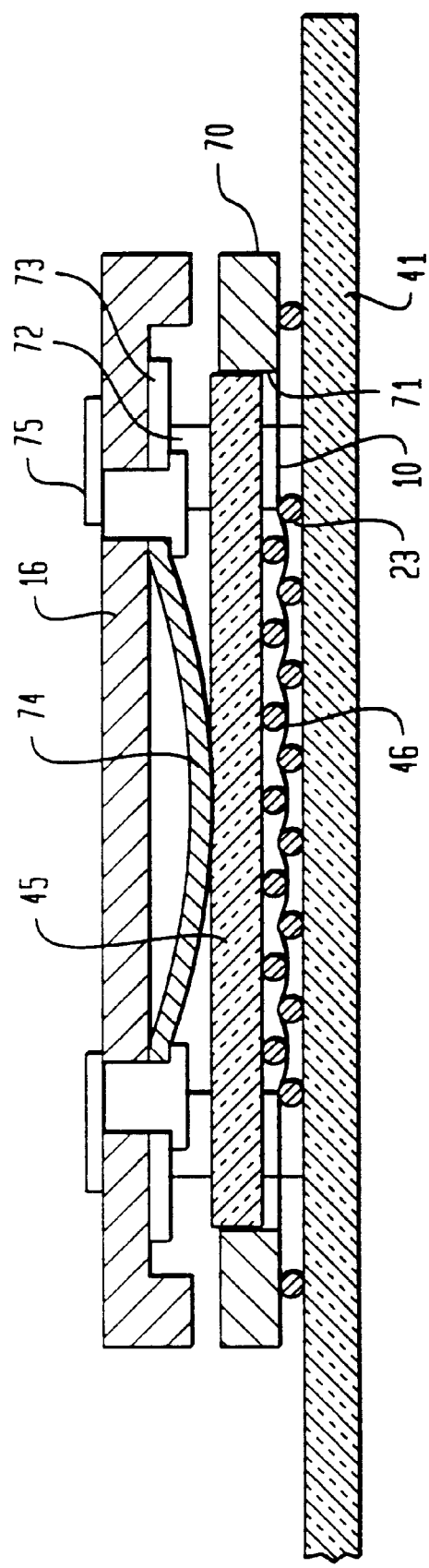
FIG. 6 is a diagrammatic sectional view of a connecting assembly in accordance with one embodiment of the invention.
Figure 7:
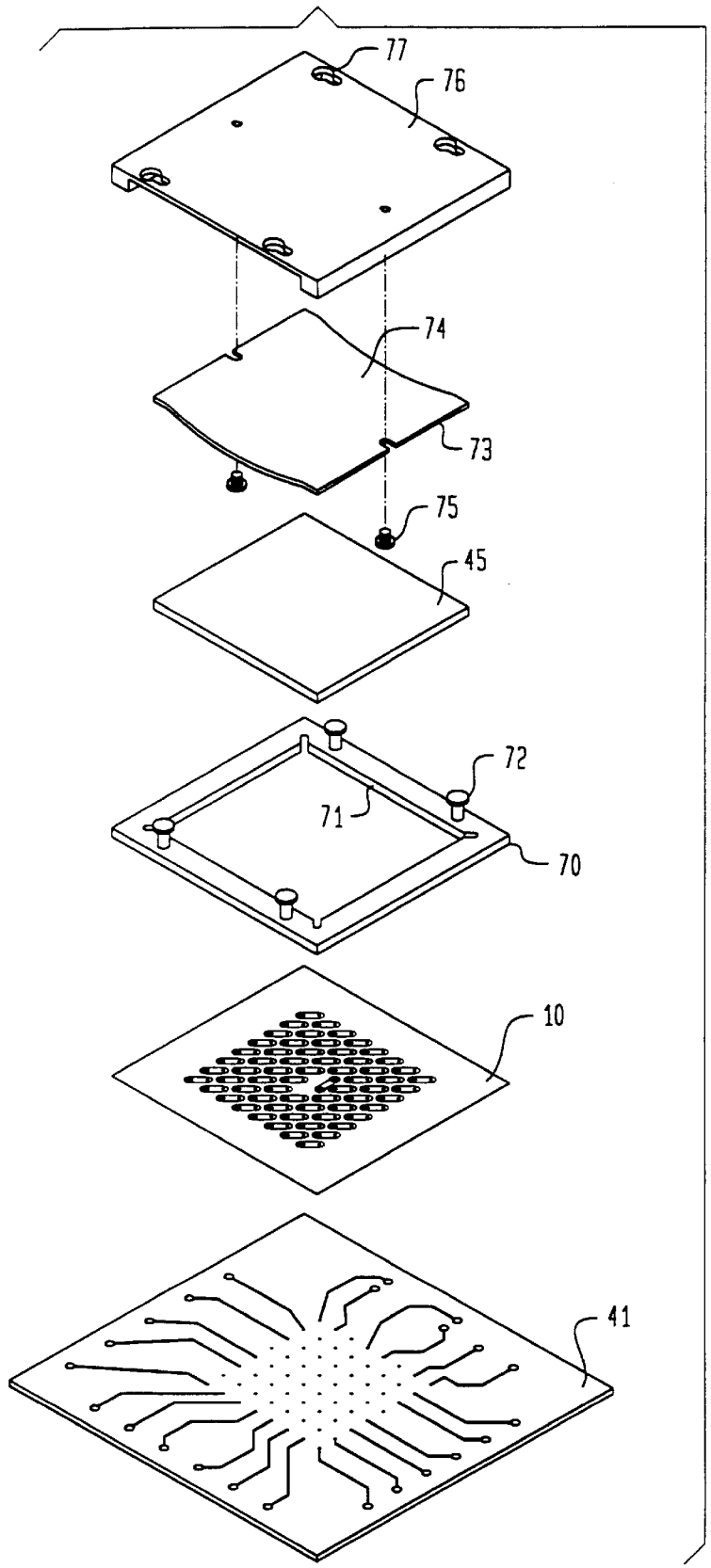
FIG. 7 is a diagrammatic exploded view of the connecting assembly of FIG. 6.

The connector of the invention may be used in conjunction with a biasing fixture 80 according to another embodiment of the invention (FIGS. 6, 7). The connector 10 is aligned with and bonded to the array of terminals 42 and the substrate. In this embodiment, the frame 70 compresses the outer periphery of the connector 10 against the substrate 41. The frame may be attached to the substrate 41 by means of pins 72 that pass through the frame 70 into holes (not shown) provided in the substrate 41. The holes provided for pin 72 are in registry with the array of terminals in the substrate, and therefore in registry with contacts 22 on the connector 10. The frame 70 is therefore aligned with the contacts.

A window 71 in the frame 70 is provided for aligning the microelectronic element 45 with the contacts in the connecting element 10. The microelectronic element 45 is urged against the connecting element 10 by a leaf spring 73 having a bowed portion 74. The leaf spring is retained in a cover 76 by two pins 75. The cover 76 may be removably attached to the frame 70 by engaging slotted holes 77 in the cover with the he ads of pins 72. With the cover 76 in place, the leaf spring 73 urges the microelectronic element 45 against the connector 10, deflecting the sheetlike element 24 as described above. The microelectronic element is thereby electrically connected to the substrate 41 for testing, burning, bonding or permanent use.

Figure 8:
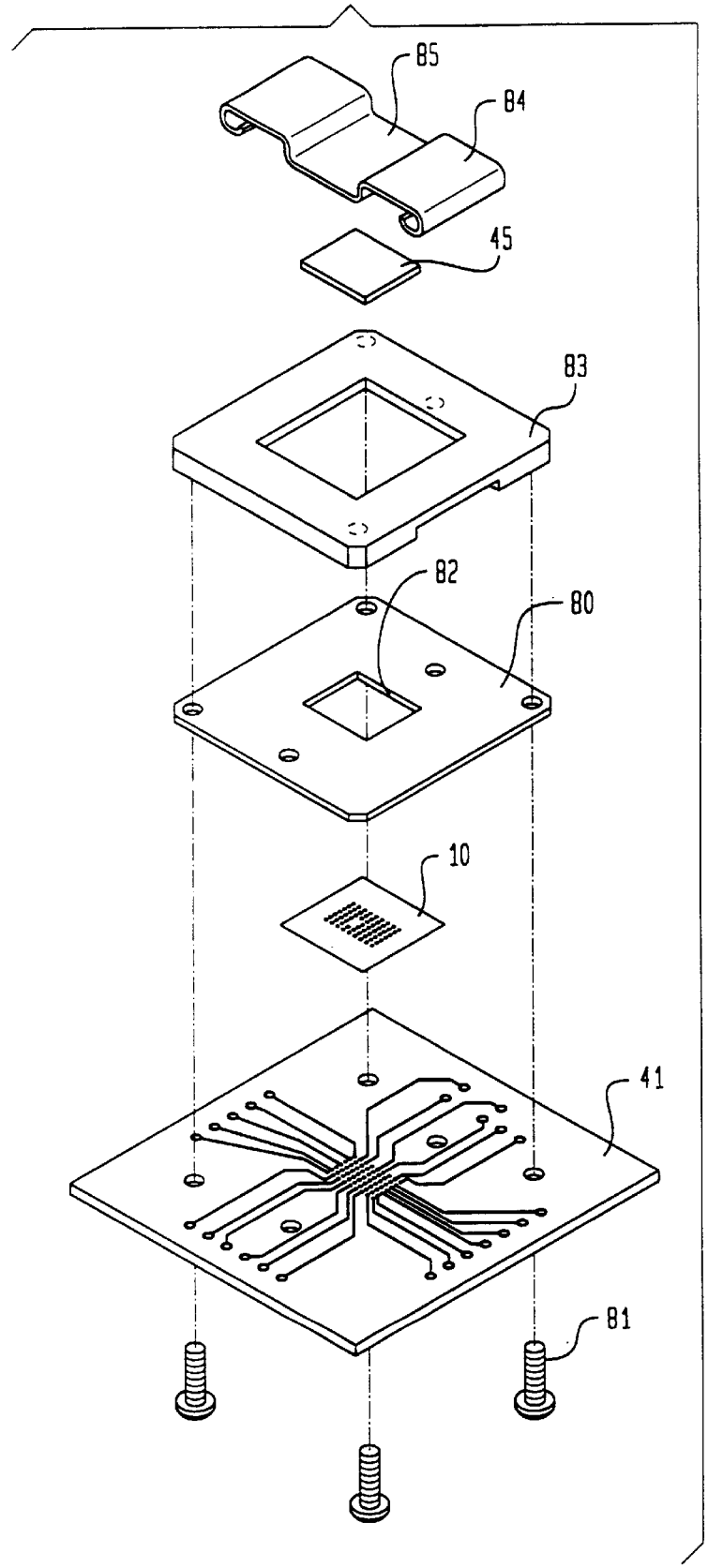
FIG. 8 is a diagrammatic exploded view of a connecting assembly in accordance with another embodiment of the invention.

In another fixture as shown in FIG. 8, a frame 80 has a window 82 for locating the microelectronic element 45 with respect to the connector 10. A cover element 83 has a larger, clearance window to provide access for insertion of the microelectronic element 45 into the window 82 in the frame 80. The frame and the cover are attached to the substrate 41 by means of screws 81. In addition, the frame may be precisely located by means of dowels (not shown) extending through the substrate and the frame. After insertion of the microelectronic element 45 into the window 82, a spring clip 84 is clipped over the cover 83. A protruding portion 85 of the spring clip 84 urges the microelectronic element 45 against the connector 10, completing the electrical connection between the microelectronic element 45 and the substrate 41.

As will readily be appreciated, numerous other variations and combinations of the features discussed above can be used without departing from the present invention. For example, the holes 27 in the sheetlike element 24 may be eliminated, and active contact 22 may comprise a continuous portion of the contact tab 21 in the area where the bump lead 46 contacts the connector 10. While such a configuration does not provide the self-centering and scraping features of the preferred embodiment, fewer process steps are necessary in fabrication. Further, the support structure between the sheetlike layer and the substrate may comprise a plurality of metallic rings, each ring centered around an active contact portion of a contact tab.

Although the invention herein has been described with reference to particular embodiments, it is to be understood that these embodiments are merely illustrative of principles and applications of the present invention. For example, the posts or spacers may be fabricated from a compliant, conductive material such as silver-filled epoxy or another material having suitable structural integrity, thereby providing additional compliance between the sockets and the underlying substrate. It is therefore to be understood that numerous modifications may be made to the illustrative embodiments and that other arrangements may be devised without departing from the spirit and scope of the present invention as defined by the appended claims.

What is claimed is:

1. A connecting assembly for connecting a microelectronic element having an array of bump leads, comprising:
   (a) a substrate having electrically conductive leads;
   (b) a resilient, sheetlike body having first and second major surfaces, said second major surface facing said substrate;
   (c) a support structure extending between said second major surface of said sheetlike body and said substrate, said support structure spacing said sheetlike body away from said substrate, said support structure having gaps and solid portions therein; and
   (d) an array of generally laminar contacts secured to said first major surface of said body in registration with the array of bump leads on the microelectronic element to be mounted, and in alignment with said gaps, each said contact surrounded by an associated portion of said sheetlike body supported at its periphery by said solid portions of said support structure, at least a portion of said sheetlike body surrounding each said contact in alignment with said gaps being at least partially uninterrupted, whereby said contacts are deflectable toward said substrate upon urging the bump leads on the microelectronic element against said contacts.

2. A connecting assembly as claimed in claim 1, wherein said support structure is a support layer and said gaps are holes, and wherein an edge of said hole defines said periphery of said portion of said sheetlike body associated with a corresponding contact.

3. A connecting assembly as claimed in claim 1, wherein said sheetlike body has a plurality of holes disposed in an array corresponding to said array of contacts, and each said contact extends inwardly over one said hole from said first major surface.

4. A connecting assembly as claimed in claim 1, wherein said contacts have asperities protruding upwardly therefrom for contacting the microelectronic element.

5. A connecting assembly as claimed in claim 1, wherein said sheetlike body further has relief apertures in said portions associated with said contacts, whereby said sheetlike body has increased flexibility.

6. A connecting assembly as claimed in claim 1, wherein said contacts are coated with solder.

7. A connecting assembly as claimed in claim 1, further comprising conductive traces on said second major surface of said sheetlike body for interconnecting said contacts.

8. A connecting assembly as claimed in claim 1, wherein an anti-wetting agent is deposited on said contacts.

9. A connecting assembly as claimed in claim 1, further comprising:
   (a) a frame for aligning the microelectronic element to the sheetlike body;
   (b) a biasing structure for urging the microelectronic element against the sheetlike body.

10. A connecting assembly as claimed in claim 1, further comprising a conductive layer on said second major surface of said sheetlike body for controlling impedance said assembly.

11. A connecting assembly as claimed in claim 10, further comprising conductive traces on said second major surface of said sheetlike body for interconnecting said contacts.

12. A connecting assembly as claimed in claim 1, wherein said support structure is an array of posts.

13. A connecting assembly as claimed in claim 12, wherein said array of posts is electrically connected to the leads of the substrate, and said contacts of said array are electrically connected to said posts.

14. A connecting assembly as claimed in claim 12, wherein each said associated portion of said sheetlike body is supported by four posts.

15. A connecting assembly as claimed in claim 12, wherein said array of contacts and said array of posts are rectilinear arrays having row and column directions, and wherein said posts are offset from said contacts in diagonal directions, oblique to said row and column directions.

16. A connecting assembly as claimed in claim 12, wherein the posts are solid core solder balls.

17. A connecting assembly as claimed in claim 12, wherein the posts are vias.

18. A connecting assembly as claimed in claim 12, wherein a group of three or more of said posts surrounds each contact.

19. A connecting assembly as claimed in claim 18, wherein at least one post of said group of posts electrically connects a respective contact to a lead on said substrate.

20. A connecting assembly as claimed in claim 18, wherein said portions of said sheetlike body associated with respective contacts deflect in response to downward forces exerted by respective bump leads.

21. A connector for mounting a microelectric element to a substrate comprising:
   (a) a resilient, sheetlike body having first and second major surfaces;
   (b) a plurality of generally laminar contacts secured to said first major surface of said body, disposed in an array corresponding to an array of bump leads on the microelectronic element to be mounted, each said contact being adapted to engage a corresponding bump lead; and
   (c) an array of posts on said second major surface of said sheetlike element, offset from and electrically connected to said contacts, whereby said posts can be bonded to a substrate to electrically connect said contacts to said substrate and to support said body with a standoff space between said body and said substrate, and whereby a microelectronic element cam be connected to said substrate by urging said microelectronic element against said body so that bump leads on the element are engaged by said contacts on the body, and portions of said body surrounding said contacts are at least partially uninterrupted and are resiliently deflected into said standoff space.

22. A connector as claimed in claim 21, further comprising a protective layer formed over said leads.

23. A connector as claimed in claim 21, wherein each said post comprises a solid core solder ball.

24. A connector as claimed in claim 21, wherein said array of contacts and said array of terminal posts are rectilinear arrays having row and column directions, and wherein said terminal posts are offset from said contacts in diagonal directions, oblique to said row and column directions.

25. A connector as claimed in claim 21, further comprising support posts for further supporting said body, said support posts not being electrically connected to any contact.

26. A connector as claimed in claim 21, wherein said sheetlike body has an array of holes corresponding to said array of posts, and wherein said terminal posts are electrically connected to said contacts through said holes.

27. A connector as claimed in claim 26, further comprising a plurality of laminar contact tabs on said first surface of said sheetlike body electrically connecting said contacts and said posts.

28. A connector as claimed in claim 21, wherein said sheetlike body has a plurality of holes disposed in an array corresponding to said array of contacts, and each said contact extends inwardly over one said hole from said first major surface.

29. A connector as claimed in claim 28, wherein each said contact includes at least one projection extending over the hole associated with that contact.

30. A connector as claimed in claim 29, wherein each said contact includes a plurality of projections extending inwardly from circumferentially spaced locations around the hole.

31. A socket for engaging a bump lead on a microelectronic element, comprising:
  a resilient, dielectric sheet having first and second major surfaces;
  an electrically conductive contact secured to said first major surface of said sheet, said contact having an active contact portion, at least a portion of said sheet surrounding said active portion of said contact being at least partially uninterrupted;
  a supporting substrate having a first surface, said substrate first surface juxtaposed with said sheet second major surface, said substrate having a conductive terminal thereon; and
  a plurality of posts spaced around said active contact portion, said posts mechanically supporting a portion of said sheet surrounding said contact with respect to said substrate such that there is a gap between said sheet and said substrate, one of said posts electrically connecting said terminal and said contact, whereby said sheet deflects as the bump lead is engaged with the active contact portion of the contact.

32. A socket as claimed in claim 31 wherein an aperture extends between said major surfaces of said sheet, and wherein said active contact portion of said contact is aligned with said aperture and extends partially over said aperture.

33. A socket as claimed in claim 31, wherein the posts are solid core solder balls.

34. A socket as claimed in claim 31, wherein the posts are vias.

35. A socket as claimed in claim 31, wherein said contact comprises a generally laminar contact.

36. A socket as claimed in claim 31, further comprising a spacer positioned between each of the posts and the first surface of the substrate, said spacer electrically connecting said posts to said terminals, whereby the spacer provides greater vertical height for said deflection of the sheet.

37. A socket as claimed in claim 36, wherein the spacer includes a laminar substrate having an aperture aligned with the active contact portion of the contact.

38. A socket as claimed in claim 31, further comprising a second contact and a second plurality of posts mechanically supporting a second portion of said sheet surrounding a second active contact portion of said second contact, wherein said first plurality of posts and said second plurality of posts have at least one post in common.

39. A socket as claimed in claim 38, wherein the sheet further includes conductive traces secured to said second major surface, said conductive traces electrically interconnecting said first and second contacts on the sheet.

40. A connector for engaging bump leads on a microelectronic element, comprising:
  a resilient, dielectric sheet having first and second major surfaces, electrically conductive contacts secured to said first major surface of said sheet, said contacts each having an active contact portion, at least a portion of said sheet surrounding said active portion of said contact being at least partially uninterrupted;
  a generally rigid substrate having terminals thereon; and
  a plurality of posts supporting said sheet with respect to said substrate such that a gap is formed therebetween; each said contact being located on an associated portion of said sheet supported by an associated group of posts;
  wherein groups of posts associated with adjacent contacts share at least one post.

41. A connector as claimed in claim 40, wherein said contacts comprise generally laminar contacts.

42. A connector as claimed in claim 41, wherein said bump leads engage said laminar contacts.

43. A method of making connections to a microelectronic element having an array of bump leads thereon, comprising the steps of:
  (a) providing a connector having a sheetlike body, a substrate, an array of contacts on a first major surface of the sheetlike body, and an array of posts connecting a second major surface of the sheetlike body to a top surface of the substrate, and spacing the sheetlike body away from the substrate, each of the contacts being disposed on a portion of the sheetlike body having at its perimeter two or more of said posts, at least a portion of said sheetlike body surrounding each said contact remote from said posts being at least partially uninterrupted;
  (b) aligning the microelectronic element with the connector so that the array of contacts is substantially in registration with the array of bump leads; and
  (c) urging the microelectronic element toward the sheetlike body so that the array of bump leads contacts the array of contacts and each said portion of the sheetlike body is resiliently deflected between two or more of said posts and a bump lead.

44. A method as claimed in claim 43, wherein said contacts comprise generally laminar contacts.

45. A method as claimed in claim 43, wherein each said contact is electrically connected to one of said posts, and wherein said posts are electrically connected to leads in said substrate, whereby said urging step makes electrical connections between the bump leads and the leads in the substrate.

46. A method as claimed in claim 45, further comprising the steps of:

(d) electrically testing said microelectronic element through said electrical connections to determine whether said microelectronic element is acceptable; and (e) if said microelectronic element is acceptable, permanently bonding said contacts to said bump leads.

* * * * *

UNITED STATES PATENT AND TRADEMARK OFFICE
CERTIFICATE OF CORRECTION

PATENT NO. : 6,086,386
DATED : July 11, 2000
INVENTOR(S) : Fjelstad et al.

It is certified that error appears in the above-identified patent and that said Letters Patent is hereby corrected as shown below:

Col. 3, line 63, delete "a".

Col. 5, line 1, "standalone" should read --stand-alone--.

Col. 8, line 30, "on e" should read --one--.

Col. 8, line 40, delete "3".

Col. 9, line 18, "29" should read --2a--.

Col. 16, line 47, "he ads" should read --heads--.

Col. 18, line 17, after "impedance" insert --in--.

Col. 18, line 66, "cam" should read --can--.

Signed and Sealed this

Tenth Day of April, 2001

NICHOLAS P. GODICI

*Attest:*

*Attesting Officer*     *Acting Director of the United States Patent and Trademark Office*